United States Patent
Du et al.

(10) Patent No.: US 10,559,372 B2
(45) Date of Patent: Feb. 11, 2020

(54) SHIFT REGISTER CIRCUIT, GATE DRIVING CIRCUIT, DISPLAY APPARATUS AND METHOD FOR DRIVING THE SAME

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Ruifang Du, Beijing (CN); Xiaoye Ma, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/511,665

(22) Filed: Jul. 15, 2019

(65) Prior Publication Data

US 2020/0020410 A1 Jan. 16, 2020

(30) Foreign Application Priority Data

Jul. 13, 2018 (CN) .......................... 2018 1 0772573

(51) Int. Cl.
G11C 19/28 (2006.01)
G09G 3/36 (2006.01)
G09G 3/3266 (2016.01)

(52) U.S. Cl.
CPC ........... *G11C 19/28* (2013.01); *G09G 3/3266* (2013.01); *G09G 3/3677* (2013.01); *G11C 19/287* (2013.01); *G09G 2300/0408* (2013.01); *G09G 2310/0286* (2013.01); *G09G 2320/041* (2013.01)

(58) Field of Classification Search
CPC .... G11C 19/28; G11C 19/287; G09G 3/3266; G09G 3/3674; G09G 3/3677; G09G 2300/0408; G09G 2310/0286; G09G 2320/041
See application file for complete search history.

(56) References Cited

U.S. PATENT DOCUMENTS

| | | | |
|---|---|---|---|
| 10,170,032 B2* | 1/2019 | Feng ..................... | G11C 19/184 |
| 2017/0309240 A1* | 10/2017 | Zhang ..................... | G09G 3/36 |
| 2019/0096307 A1* | 3/2019 | Liang ..................... | G09G 3/20 |

FOREIGN PATENT DOCUMENTS

WO WO-2019062281 A1 * 4/2019 ............... G09G 3/36

* cited by examiner

*Primary Examiner* — Patrick O Neill
(74) *Attorney, Agent, or Firm* — McDermott Will & Emery LLP

(57) ABSTRACT

A shift register circuit includes a first output sub-circuit, and a second output sub-circuit. The first output sub-circuit is coupled to a clock signal terminal, a control signal terminal, a pull-up node and an output signal terminal, and is configured to output a clock signal output via the clock signal terminal to the output signal terminal under control of the control signal output via a control signal terminal and the potential of the pull-up node. The second output sub-circuit is coupled to the clock signal terminal, the pull-up node and the output signal terminal, and is configured to output the clock signal to the output signal terminal under control of the potential of the pull-up node.

20 Claims, 10 Drawing Sheets

SHIFT REGISTER CIRCUIT, GATE DRIVING CIRCUIT, DISPLAY APPARATUS AND METHOD FOR DRIVING THE SAME

This application claims priority to and benefit of Chinese Patent Application No. 201810772573.4, filed on Jul. 13, 2018, titled "SHIFT REGISTER UNIT, GATE DRIVING CIRCUIT, DISPLAY APPARATUS AND METHOD FOR DRIVING THE SAME", which is incorporated herein by reference in its entirety.

TECHNICAL FIELD

The present disclosure relates to the field of display technologies, and in particular, to a shift register circuit, a gate driving circuit, a display apparatus and a method for driving the same.

BACKGROUND

A technology of Gate Driver on Array (GOA) is a technology that a plurality of shift register circuits are integrated on an array substrate to form a driving circuit. The gate driving circuit fabricated by the GOA technology has advantages of low cost, conducive to achieving a display screen having a narrow frame, and the like, which makes the gate driving circuit fabricated by the GOA technology widely used.

SUMMARY

In an aspect, a shift register circuit is provided. The shift register circuit comprises a first output sub-circuit and a second output sub-circuit. The first output sub-circuit is coupled to a clock signal terminal, a control signal terminal, a pull-up node and an output signal terminal, and is configured to output a clock signal output via the clock signal terminal to the output signal terminal under control of a control signal having first level output via the control signal terminal and the potential of the pull-up node, and to be turned off under control of a control signal having second level output via the control signal terminal. The second output sub-circuit is coupled to the clock signal terminal, the pull-up node and the output signal terminal, and is configured to output the clock signal to the output signal terminal under control of the potential of the pull-up node.

In some embodiments, the first output sub-circuit includes a first transistor and a second transistor. A control electrode of the first transistor is coupled to the control signal terminal, a first electrode of the first transistor is coupled to the pull-up node, and a second electrode of the first transistor is coupled to the control electrode of the second transistor. A first electrode of the second transistor is coupled to the clock signal terminal, and a second electrode of the second transistor is coupled to the output signal terminal.

In some embodiments, the first output sub-circuit further includes a third transistor. A control electrode of the third transistor is coupled to the second electrode of the first transistor, a first electrode of the third transistor is coupled to the second electrode of the second transistor, and a second electrode of the third transistor is coupled to the output signal terminal. The second electrode of the second transistor is indirectly coupled to the output signal terminal via the third transistor.

In some embodiments, the shift register circuit further comprises a first noise reduction sub-circuit. The first noise reduction sub-circuit is coupled to a first noise reduction signal terminal, a power supply voltage signal terminal and the first output sub-circuit, and is configured to output a power supply voltage signal output via the power supply voltage signal terminal to the first output sub-circuit under control of a first noise reduction signal output via the first noise reduction signal terminal.

In some embodiments, the first noise reduction sub-circuit includes a fourth transistor and a fifth transistor. A control electrode of the fourth transistor is coupled to the first noise reduction signal terminal, a first electrode of the fourth transistor is coupled to the power supply voltage signal terminal, and a second electrode of the fourth transistor is coupled to the control electrode of the second transistor and the control electrode of the third transistor. A control electrode of the fifth transistor is coupled to the first noise reduction signal terminal, a first electrode of the fifth transistor is coupled to the power supply voltage signal terminal, and a second electrode of the fifth transistor is coupled to the second electrode of the second transistor and the first electrode of the third transistor.

In some embodiments, the second output sub-circuit includes a sixth transistor and a capacitor. A control electrode of the sixth transistor is coupled to the pull-up node, a first electrode of the sixth transistor is coupled to the clock signal terminal, and a second electrode of the sixth transistor is coupled to the output signal terminal. One end of the capacitor is coupled to the pull-up node, and another end of the capacitor is coupled to the output signal terminal.

In some embodiments, the shift register circuit further comprises an input sub-circuit, at least one pull-down sub-circuit, a first reset sub-circuit, and at least one pull-down control sub-circuit. The input sub-circuit is coupled to an input signal terminal and the pull-up node, and is configured to output an input signal output via the input signal terminal to the pull-up node under control of the input signal. Each pull-down sub-circuit is coupled to a corresponding pull-down voltage signal terminal, the pull-up node, a corresponding pull-down node, and a power supply voltage signal terminal. Each pull-down sub-circuit is configured to output a corresponding pull-down voltage signal output via the corresponding pull-down voltage signal terminal to the corresponding pull-down node under control of the corresponding pull-down voltage signal, and is configured to output a power supply voltage signal output via the power supply voltage signal terminal to the corresponding pull-down node under control of the potential of the pull-up node. The first reset sub-circuit is coupled to a first reset signal terminal, the pull-up node and the power supply voltage signal terminal, and is configured to output the power supply voltage signal to the pull-up node under control of a first reset signal output via the first reset signal terminal. Each pull-down control sub-circuit is coupled to the pull-up node, a corresponding pull-down node, the output signal terminal and the power supply voltage signal terminal, and is configured to output the power supply voltage signal to the pull-up node and the output signal terminal under control of the potential of the corresponding pull-down node. The at least one pull-down sub-circuit is configured to be turned on in sequence, and only one pull-down sub-circuit is configured to be turned on during a same time period. The pull-down sub-circuit and the pull-down control sub-circuit coupled to the same pull-down node are configured to be simultaneously turned on or turned off.

In some embodiments, the input sub-circuit includes a seventh transistor. A control electrode and a first electrode of the seventh transistor are coupled to the input signal terminal, and a second electrode of the seventh transistor is coupled to the pull-up node. Each pull-down sub-circuit includes a first pull-down transistor, a second pull-down transistor, a third pull-down transistor, and a fourth pull-down transistor. A control electrode and a first electrode of the first pull-down transistor are coupled to the corresponding pull-down voltage signal terminal, and a second electrode of the first pull-down transistor is coupled to a control electrode of the second pull-down transistor. A first electrode of the second pull-down transistor is coupled to the corresponding pull-down voltage signal terminal, and a second electrode of the second pull-down transistor is coupled to the corresponding pull-down node. A control electrode of the third pull-down transistor is coupled to the pull-up node, a first electrode of the third pull-down transistor is coupled to the power supply voltage signal terminal, and a second electrode of the third pull-down transistor is coupled to the control electrode of the second pull-down transistor. A control electrode of the fourth pull-down transistor is coupled to the pull-up node, a first electrode of the fourth pull-down transistor is coupled to the power supply voltage signal terminal, and a second electrode of the fourth pull-down transistor is coupled to the corresponding pull-down node. The first reset sub-circuit includes a twelfth transistor. A control electrode of the twelfth transistor is coupled to the first reset signal terminal, a first electrode of the twelfth transistor is coupled to the power supply voltage signal terminal, and a second electrode of the twelfth transistor is coupled to the pull-up node. Each pull-down control sub-circuit includes a first pull-down control transistor and a second pull-down control transistor. A control electrode of the first pull-down control transistor is coupled to the corresponding pull-down node, a first electrode of the first pull-down control transistor is coupled to the power supply voltage signal terminal, and a second electrode of the first pull-down control transistor is coupled to the pull-up node. A control electrode of the second pull-down control transistor is coupled to the corresponding pull-down node, a first electrode of the second pull-down control transistor is coupled to the power supply voltage signal terminal, and a second electrode of the second pull-down control transistor is coupled to the output signal terminal.

In some embodiments, the at least one pull-down sub-circuit includes a first pull-down sub-circuit and a second pull-down sub-circuit. The at least one pull-down control sub-circuit includes a first pull-down control sub-circuit and a second pull-down control sub-circuit. The pull-down node includes a first pull-down node and a second pull-down node. The first pull-down sub-circuit is coupled to the first pull-down node and is further coupled to a first pull-down voltage signal terminal via which a first pull-down voltage signal is output. The second pull-down sub-circuit is coupled to the second pull-down node and is further coupled to a second pull-down voltage signal terminal via which a second pull-down voltage signal is output. The first pull-down control sub-circuit is coupled to the first pull-down node, and the second pull-down control sub-circuit is coupled to the second pull-down node. The first pull-down sub-circuit and the second pull-down sub-circuit are configured to be alternately turned on or turned off, and the first pull-down control sub-circuit and the second pull-down control sub-circuit are configured to be alternately turned on or turned off. The first pull-down sub-circuit and the first pull-down control sub-circuit are configured to be simultaneously turned on or turned off, and the second pull-down sub-circuit and the second pull-down control sub-circuit are configured to be simultaneously turned on or turned off.

In some embodiments, the shift register circuit further comprises a second reset sub-circuit. The second reset sub-circuit is coupled to a second reset signal terminal, the output signal terminal and the power supply voltage signal terminal, and is configured to output a voltage of the power supply voltage signal terminal to the output signal terminal under control of a second reset signal output via the second reset signal terminal.

In some embodiments, the second reset sub-circuit includes a fifteenth transistor. A control electrode of the fifteenth transistor is coupled to the second reset signal terminal, a first electrode of the fifteenth transistor is coupled to the power supply voltage signal terminal, and a second electrode of the fifteenth transistor is coupled to the output signal terminal.

In some embodiments, the shift register circuit further comprises a second noise reduction sub-circuit. The second noise reduction sub-circuit is coupled to a second noise reduction signal terminal, a power supply voltage signal terminal, the pull-up node and the output signal terminal, and is configured to output the power supply voltage signal to the pull-up node and the output signal terminal under control of a second noise reduction signal output via the second noise reduction signal terminal.

In some embodiments, the second noise reduction sub-circuit includes a twenty-second transistor and a twenty-third transistor. A control electrode of the twenty-second transistor is coupled to the second noise reduction signal terminal, a first electrode of the twenty-second transistor is coupled to the power supply voltage signal terminal, and a second electrode of the twenty-second transistor is coupled to the pull-up node. A control electrode of the twenty-third transistor is coupled to the second noise reduction signal terminal, a first electrode of the twenty-third transistor is coupled to the power supply voltage signal terminal, and a second electrode of the twenty-third transistor is coupled to the output signal terminal.

In some embodiments, the first output sub-circuit includes a first transistor, a second transistor, and a third transistor. A control electrode of the first transistor is coupled to the control signal terminal, a first electrode of the first transistor is coupled to the pull-up node, and a second electrode of the first transistor is electrically coupled to a control electrode of the second transistor and a control electrode of the third transistor. A first electrode of the second transistor is coupled to the clock signal terminal, and a second electrode of the second transistor is coupled to a first electrode of the third transistor. A second electrode of the third transistor is coupled to the output signal terminal. The second output sub-circuit includes a sixth transistor and a capacitor. A control electrode of the sixth transistor is coupled to the pull-up node, a first electrode of the sixth transistor is coupled to the clock signal terminal, and a second electrode of the sixth transistor is coupled to the output signal terminal. One end of the capacitor is coupled to the pull-up node, and another end of the capacitor is coupled to the output signal terminal.

The shift register circuit further comprises an input sub-circuit, a first pull-down sub-circuit, a first reset sub-circuit, and a first pull-down control sub-circuit. The input sub-circuit includes a seventh transistor. A control electrode and a first electrode of the seventh transistor are coupled to an input signal terminal, and a second electrode of the seventh transistor is coupled to the pull-up node. The first pull-down sub-circuit includes an eighth transistor, a ninth transistor, a tenth transistor, and an eleventh transistor. A control electrode and a first electrode of the eighth transistor are coupled to a first pull-down voltage signal terminal, and a second electrode of the eighth transistor is coupled to a control electrode of the ninth transistor. A first electrode of the ninth transistor is coupled to the first pull-down voltage signal terminal, and a second electrode of the ninth transistor is coupled to a first pull-down node. A control electrode of the tenth transistor is coupled to the pull-up node, a first electrode of the tenth transistor is coupled to a power supply voltage signal terminal, and a second electrode of the tenth transistor is coupled to the control electrode of the ninth transistor. A control electrode of the eleventh transistor is coupled to the pull-up node, a first electrode of the eleventh transistor is coupled to the power supply voltage signal terminal, and a second electrode of the eleventh transistor is coupled to the first pull-down node. The first reset sub-circuit includes a twelfth transistor. A control electrode of the twelfth transistor is coupled to a first reset signal terminal, a first electrode of the twelfth transistor is coupled to the power supply voltage signal terminal, and a second electrode of the twelfth transistor is coupled to the pull-up node. The first pull-down control sub-circuit includes a thirteenth transistor and a fourteenth transistor. A control electrode of the thirteenth transistor is coupled to the first pull-down node, a first electrode of the thirteenth transistor is coupled to the power supply voltage signal terminal, and a second electrode of the thirteenth transistor is coupled to the pull-up node. A control electrode of the fourteenth transistor is coupled to the first pull-down node, a first electrode of the fourteenth transistor is coupled to the power supply voltage signal terminal, and a second electrode of the fourteenth transistor is coupled to the output signal terminal.

In some embodiments, the shift register circuit further includes a first noise reduction sub-circuit, a second reset sub-circuit, a second pull-down sub-circuit, a second pull-down control sub-circuit, and a second noise reduction sub-circuit. The first noise reduction sub-circuit includes a fourth transistor and a fifth transistor. A control electrode of the fourth transistor is coupled to a first noise reduction signal terminal, a first electrode of the fourth transistor is coupled to the power supply voltage signal terminal, a second electrode of the fourth transistor is coupled to the control electrode of the second transistor and the control electrode of the third transistor. A control electrode of the fifth transistor is coupled to the first noise reduction signal terminal, a first electrode of the fifth transistor is coupled to the power supply voltage signal terminal, and a second electrode of the fifth transistor is coupled to the second electrode of the second transistor and the first electrode of the third transistor. The second reset sub-circuit includes a fifteenth transistor. A control electrode of the fifteenth transistor is coupled to a second reset signal terminal, a first electrode of the fifteenth transistor is coupled to the power supply voltage signal terminal, and a second electrode of the fifteenth transistor is coupled to the output signal terminal. The second pull-down sub-circuit includes a sixteenth transistor, a seventeenth transistor, an eighteenth transistor, and a nineteenth transistor. A control electrode and a first electrode of the sixteenth transistor are coupled to a second pull-down voltage signal terminal, and a second electrode of the sixteenth transistor is coupled to a control electrode of the seventeenth transistor. A first electrode of the seventeenth transistor is coupled to the second pull-down voltage signal terminal, and a second electrode of the seventeenth transistor is coupled to a second pull-down node. A control electrode of the eighteenth transistor is coupled to the pull-up node, a first electrode of the eighteenth transistor is coupled to the power supply voltage signal terminal, and a second electrode of the eighteenth transistor is coupled to the control electrode of the seventeenth transistor. A control electrode of the nineteenth transistor is coupled to the pull-up node, a first electrode of the nineteenth transistor is coupled to the power supply voltage signal terminal, and a second electrode of the nineteenth transistor is coupled to the second pull-down node. The second pull-down control sub-circuit includes a twentieth transistor and a twenty-first transistor. A control electrode of the twentieth transistor is coupled to the second pull-down node, a first electrode of the twentieth transistor is coupled to the power supply voltage signal terminal, and a second electrode of the twentieth transistor is coupled to the pull-up node. A control electrode of the twenty-first transistor is coupled to the second pull-down node, a first electrode of the twenty-first transistor is coupled to the power supply voltage signal terminal, and a second electrode of the twenty-first transistor is coupled to the output signal terminal. The second noise reduction sub-circuit includes a twenty-second transistor and a twenty-third transistor. A control electrode of the twenty-second transistor is coupled to a second noise reduction signal terminal, a first electrode of the twenty-second transistor is coupled to the power supply voltage signal terminal, and a second electrode of the twenty-second transistor is coupled to the pull-up node. A control electrode of the twenty-third transistor is coupled to the second noise reduction signal terminal, a first electrode of the twenty-third transistor is coupled to the power supply voltage signal terminal, and a second electrode of the twenty-third transistor is coupled to the output signal terminal.

In another aspect, a gate driving circuit is provided. The gate driving circuit comprises a plurality of cascaded shift register circuits, and each shift register circuit is a shift register circuit as described above.

In some embodiments, the gate driving circuit further comprises six clock signal lines. Each shift register circuit includes an input signal terminal, a clock signal terminal, a first reset signal terminal, and an output signal terminal. The plurality of shift register circuits are divided into a plurality of sets of shift register circuits, each set of shift register circuits includes six adjacent shift register circuits, and clock signal terminals of the six adjacent shift register circuits of each set of shift register circuits are coupled to the six clock signal lines in a one to one correspondence. Input signal terminals of the first three stages of shift register circuits are coupled to a frame start signal terminal. Except the first three stages of shift register circuits, the input signal terminal of the Nth stage shift register circuit is coupled to the output signal terminal of the (N−3)th stage shift register circuit. First reset signal terminals of the last four stages of the shift register circuits are coupled to output signal terminals of four stages of dummy shift register circuits in a one to one correspondence, and except the last four stages of the shift register circuits, the first reset signal terminal of the Nth stage shift register circuit is coupled to the output signal terminal of the (N+4)th stage shift register circuit.

In some embodiments, each shift register circuit further includes a second reset signal terminal and/or a first noise reduction signal terminal. The second reset signal terminal of the Nth stage shift register circuit is coupled to the output signal terminal of the (N+3)th stage shift register circuit. The first noise reduction signal terminal of each shift register circuit is coupled to the frame start signal terminal.

In another aspect, a display apparatus is provided. The display apparatus includes a state detection device, a controller, and a gate driving circuit as described above. The state detection device is configured to detect an operating state of the display apparatus in real time. The operating state includes operating temperature or refresh frequency. The controller is configured to generate and output a control signal having first level in a case where the operating state of the display apparatus satisfies a set condition, and is configured to generate and output a control signal having second level in a case where the operating state of the display apparatus does not satisfy the set condition. The set condition is that the operating temperature of the display apparatus is lower than a preset operating temperature, or the refresh frequency of the display apparatus is greater than a preset refresh frequency. The control signal terminal of each shift register circuit of the gate driving circuit is coupled to the controller and receives the control signal having first level and the control signal having second level.

In yet another aspect, a method for driving a display apparatus is provided. The method for driving the display apparatus comprises the following steps. A state detection device detects an operating state of the display apparatus in real time, and the operating state includes operating temperature or refresh frequency. In a case where the operating state of the display apparatus satisfies a set condition, a controller generates a control signal having first level, and outputs the control signal to each shift register circuit of a gate driving circuit. The set condition is that the operating temperature of the display apparatus is lower than a preset operating temperature, or the refresh frequency of the display apparatus is greater than a preset refresh frequency. A first output sub-circuit of each shift register circuit outputs a clock signal to an output signal terminal under control of the control signal having first level and the potential of a pull-up node, and a second output sub-circuit of each shift register circuit outputs the clock signal to the output signal terminal under control of the potential of the pull-up node. In a case where the operating state of the display apparatus does not satisfy the set condition, a controller generates a control signal having second level, and outputs the control signal to each shift register circuit of a gate driving circuit. The first output sub-circuit of each shift register circuit is turned off under control of the control signal having second level, and the second output sub-circuit of each shift register circuit outputs the clock signal to the output signal terminal under control of the potential of the pull-up node.

BRIEF DESCRIPTION OF THE DRAWINGS

In order to describe technical solutions in embodiments of the present disclosure more clearly, the accompanying drawings to be used in the description of the present disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
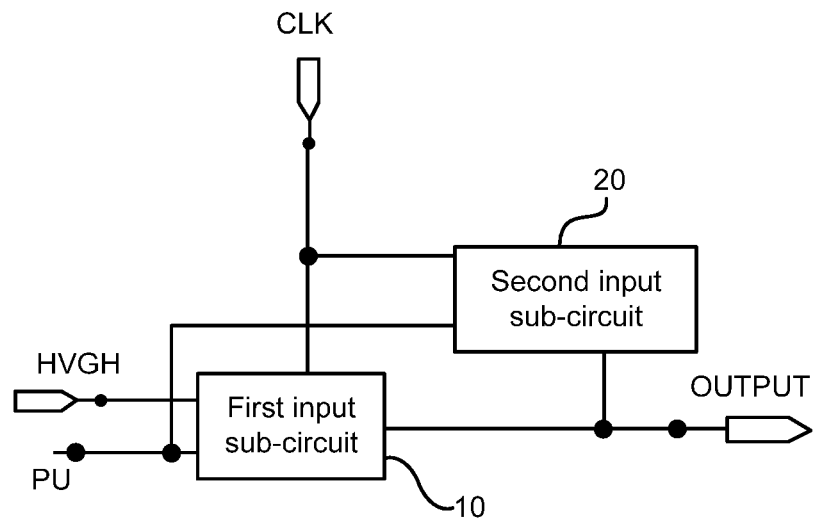
FIG. 1 is a schematic diagram showing a structure of a shift register circuit in accordance with some embodiments.

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art shall be included in the protection scope of the present disclosure.

The "low temperature environment" mentioned in the embodiments of the present disclosure refers to a temperature environment that has significant adverse effects on the migration rate of the carriers of the output transistors in the gate driving circuit. The "non-low temperature environment" refers to a temperature environment that does not have adverse effects or significant adverse effects on the migration rate of the carriers of the output transistors in the gate driving circuit. For example, a temperature range that has significant effects on the migration rate of the carriers of the output transistors in the gate driving circuit is −20° C.~−50° C., such as −20° C., −25° C., −30° C., −35° C., −40° C., −45° C., −50° C., or the like.

In addition, the "high frequency state" refers to a frequency state that is greater than the highest refresh frequency corresponding to a normal display of the display apparatus. The "medium-or-low frequency state" refers to a frequency state that is less than or equal to the highest refresh frequency corresponding to the normal display of the display apparatus. For example, a range of the highest refresh frequency corresponding to the normal display of the display apparatus is 60 Hz~140 Hz, such as 60 Hz, 65 Hz, 70 Hz, 75 Hz, 80 Hz, 85 Hz, 90 Hz, 95 Hz, 100 Hz, 105 Hz, 110 Hz, 115 Hz, 120 Hz, 125 Hz, 130 Hz, 135 Hz, 140 Hz, or the like.

In related arts, each shift register circuit of the gate driving circuit includes an output transistor. A control electrode of the output transistor is coupled to the pull-up node, a first electrode of the output transistor is coupled to a clock signal terminal, and a second electrode of the output transistor is coupled to an output signal terminal. Herein, the clock signal terminal is coupled to a clock signal line configured to provide a clock signal. In the output stage of each shift register circuit, the output transistor is turned on under control of the potential of the pull-up node, and the output transistor outputs a clock signal provided by the clock signal line to the output signal terminal, so as to scan and drive a corresponding gate line.

When the gate driving circuit operates in the low temperature environment, the migration rate of the carriers of the output transistor decreases. For example, for a display panel manufactured by an amorphous-Si (a-Si) process, the decrease of the migration rate of the carriers of the output transistor at low temperature causes the driving current $I_{on}$ passing through the output transistor to be greatly reduced, thereby extending the time when the clock signal is output to the output signal terminal, so that when an output signal of the output signal terminal is used to drive a gate line coupled to the output signal terminal, delay occurs. Moreover, in the gate driving circuit, when the output signal of this stage shift register circuit is used as an input signal of a next stage shift register circuit, due to the existence of delay, the ability of the output signal of this stage shift register circuit driving the next stage shift register circuit is reduced, which affects the normal operation of the display apparatus.

For some display apparatuses used in outdoor environments, such as a vehicle display apparatus, it is often necessary to work in various temperature environments (including, for example, a low temperature environment). Or, for example, a display apparatus in a cold storage or freezer, which is in a low temperature environment for a long time. In order to make this type of display apparatus suitable for using in various temperature environments, especially in the low temperature environment, in some designs, the size of each output transistor in the gate driving circuit is designed to be larger to enhance its driving ability, and to ensure that it can provide a large enough driving current $I_{on}$ when operating in the low temperature environment.

However, if the size of the output transistor is designed to be larger, in the output stage, the noise coupled to a pull-up node would increase, which is detrimental to the normal driving of the gate line. Moreover, when the gate driving circuit operates in a non-low temperature environment, the migration rate of the carriers of the output transistor is not affected by the temperature or is little affected by the temperature. Therefore, the demand for the normal driving of the gate line can be satisfied without using the large size output transistors.

In addition, in a case where the display apparatus is in a high frequency state, the clock signal is also in a high frequency state. In this case, the charging time of each row of sub-pixels will decrease. In order to ensure that the charging amount of each row of sub-pixels is constant, it is required to increase the magnitude of the driving current $I_{on}$ passing through the output transistor in the shift register corresponding to each row of sub-pixels. Therefore, it is necessary to increase the size of each output transistor. However, the large size output transistor may increase the noise coupled to the pull up node. Moreover, in a case where the display apparatus is in a medium-or-low frequency state, it does not require a large size output transistor to meet the demand for the normal driving of each row of sub-pixels.

Some embodiments of the present disclosure provide a shift register circuit SR. As shown in FIG. 1, the shift register circuit SR includes a first output sub-circuit 10, and a second output sub-circuit 20.

The first output sub-circuit 10 is coupled to a clock signal terminal CLK, a control signal terminal HVGH, a pull-up node PU, and an output signal terminal OUTPUT. Herein, the control signal terminal HVGH is configured to output a control signal Hvgh having first level or second level, the clock signal terminal CLK is configured to output a clock signal Clk, and the output signal terminal OUTPUT is configured to output a gate line scanning signal. The first output sub-circuit 10 is configured to output the clock signal Clk to the output signal terminal OUTPUT under control of the control signal Hvgh having first level and the potential of the pull-up node PU output via the control signal terminal HVGH.

The second output sub-circuit 20 is coupled to the clock signal terminal CLK, the pull-up node PU, and the output signal terminal OUTPUT respectively. The second output sub-circuit 20 is configured to output the clock signal Clk to the output signal terminal OUTPUT under control of the potential of the pull-up node PU.

In some embodiments, the control signal Hvgh is generated and input by a controller coupled to the control signal terminal HVGH of the shift register circuit SR. In a case where the operating temperature of the display apparatus is less than a preset operating temperature (i.e., the display apparatus is in a low temperature environment), or in a case where the refresh frequency of the display apparatus is greater than a preset refresh frequency (i.e., the display apparatus operates at a high frequency state), the controller generates and outputs a control signal having first level to turn on the first output sub-circuit 10. In a case where the operating temperature of the display apparatus is higher than or equals to the preset operating temperature (i.e., the display apparatus is in a non-low temperature environment), or in a case where the refresh frequency of the display apparatus is less than or equal to the preset refresh frequency (i.e., the display apparatus operates at a medium-or-low frequency state), the controller generates and outputs a control signal having second level to turn off the first output sub-circuit 10.

Based on this, in a case where the operating temperature of the display apparatus is lower than the preset operating temperature, or the refresh frequency of the display apparatus is greater than the preset refresh frequency, the control signal Hvgh having first level is output via the control signal terminal HVGH. The first output sub-circuit 10 is turned on under the control both of the control signal Hvgh and the potential of the pull-up node PU to output a clock signal Clk of the clock signal terminal CLK to the output signal terminal OUTPUT. At the same time, the second output sub-circuit 20 is turned on under control of the potential of the pull-up node PU to output the clock signal Clk of the clock signal terminal CLK to the output signal terminal OUTPUT. In this case, the first output sub-circuit 10 and the second output sub-circuit 20 operate simultaneously to output the clock signal Clk to the output signal terminal OUTPUT.

In a case where the operating temperature of the display apparatus is higher than or equals to the preset operating temperature, or the refresh frequency of the display apparatus is less than or equals to the preset refresh frequency, the control signal Hvgh having second level is output via the control signal terminal HVGH, and the first output sub-circuit 10 is turned off. In this case, the second output sub-circuit 20 is turned on under control of the potential of the pull-up node PU, and the second output sub-circuit 20 can still output the clock signal Clk of the clock signal terminal CLK to the output signal terminal OUTPUT.

In this way, in a case where the operating temperature of the display apparatus is lower than the preset operating temperature or the refresh frequency of the display apparatus is greater than the preset refresh frequency, the first output sub-circuit 10 and the second output sub-circuit 20 operate simultaneously, which is equivalent to increase the size of the output transistor, thereby increasing the driving current $I_{on}$ output from the shift register circuit SR to the gate line in a low-temperature environment or in a high-frequency state and enhancing the ability of the gate line scanning signal output via the output signal terminal OUTPUT driving the other stage shift register circuit SR. In a case where the operating temperature is higher than or equals to the preset operating temperature or the refresh frequency is less than or equals to the preset refresh frequency, the first output sub-circuit 10 does not operate and the second output sub-circuit 20 operates, which is equivalent to reduce the size of the output transistor, thereby reducing the noise coupled to the pull-up node PU.

Figure 3A:
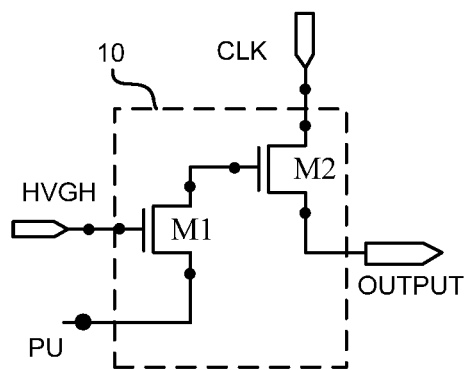
FIG. 3A is a schematic diagram showing a structure of a first output sub-circuit in accordance with some embodiments.

In some embodiments, as shown in FIG. 3A, the first output sub-circuit 10 includes a first transistor M1 and a second transistor M2.

A control electrode of the first transistor M1 is coupled to the control signal terminal HVGH, a first electrode of the first transistor M1 is coupled to the pull-up node PU, and a second electrode of the first transistor M1 is coupled to the control electrode of the second transistor M2. The first transistor M1 is turned on under control of the control signal Hvgh having first level, so that the potential of the control electrode of the second transistor M2 is the same as the potential of the pull-up node PU.

A first electrode of the second transistor M2 is coupled to the clock signal terminal CLK, and a second electrode of the second transistor M2 is coupled to the output signal terminal OUTPUT. In the case that the voltage of the control electrode of the second transistor M2 is the same as the potential of the pull-up node PU, the second transistor M2 is turned on under control of the potential of the pull-up node PU to output the clock signal Clk to the output signal terminal OUTPUT.

Figure 3B:
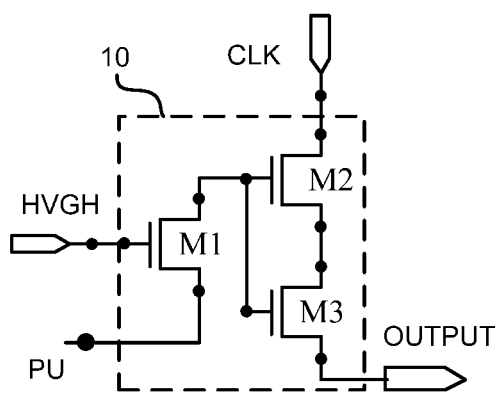
FIG. 3B is a schematic diagram showing a structure of another first output sub-circuit in accordance with some embodiments.

Based on this, as shown in FIG. 3B, the first output sub-circuit 10 further includes a third transistor M3. A control electrode of the third transistor M3 is coupled to the second electrode of the first transistor M1, a first electrode of the third transistor M3 is coupled to the second electrode of the second transistor M2, a second electrode of the third transistor M3 is coupled to the output signal terminal OUTPUT. The third transistor M3 is disposed between the second electrode of the second transistor M2 and the output signal terminal OUTPUT, so that the second electrode of the second transistor M2 is indirectly coupled to the output signal terminal OUTPUT through the third transistor M3. In a case where the potential of the control electrode of the third transistor M3 is the same as the potential of the pull-up node PU, the third transistor M3 is turned on under control of the potential of the pull-up node PU to output the clock signal Clk output via the second transistor M2 to the output signal terminal OUTPUT.

In this way, by simultaneously providing the second transistor M2 and the third transistor M3 in the first input sub-circuit 10, the dynamic power consumption of the clock signal line can be reduced. The reasons are as follows:

The dynamic power consumption of the clock signal line is expressed as $P=f_{CK} \times C_{CK} \times V_{CK}^2$. P is the dynamic power consumption of the clock signal line, $f_{CK}$ is the frequency of the clock signal of the clock signal line, $C_{CK}$ is the capacitance connected to the clock signal line, and the $V_{CK}$ is the voltage of the clock signal of the clock signal line. It can be seen that the dynamic power consumption P of the clock signal line is positively correlated with the frequency $f_{CK}$ of the clock signal and the capacitance $C_{CK}$ of the clock signal line.

For example, a gate driving circuit of the display apparatus is a 6 CLK gate driving circuit, that is, the gate driving circuit includes six clock signal lines. Moreover, the resolution ratio of the display apparatus is 2m×2n, that is, the display apparatus includes 2n rows of gate lines. Each row of gate lines needs to be driven by a shift register circuit, which means that each clock signal line needs to be coupled to 2n/6 shift register circuits. Output transistors included in each shift register circuit have gate-source capacitance $C_{gs}$, therefore, the capacitance $C_{CK}$ connected to each clock signal line due to the output transistor is $(2n \times C_{gs})/6$. The period of the clock signal of each clock signal line is 6H, where H is the time required to turn on a row of gate lines, and the frequency $f_{CK}$ of the clock signal is ⅙H. It can be seen from the above analysis that when the size of the output transistor is designed to be larger, the gate-source capacitance $C_{gs}$ is increased, so that the capacitance $C_{CK}$ connected to the clock signal line is increased, thereby increasing the dynamic power consumption P of the clock signal line.

In the above embodiment of the present disclosure, by simultaneously providing the second transistor M2 and the third transistor M3 in the first input sub-circuit 10, the second transistor M2 is directly coupled to the clock signal line, and the third transistor M3 is not directly coupled to the clock signal line, so that the capacitance $C_{CK}$ connected to the clock signal line is affected by a gate-source capacitance $C_{gs}$ of the second transistor M2, and is not affected by a gate-source capacitance $C_{gs}$ of the third transistor M3, thereby reducing the capacitance $C_{CK}$ connected to the clock signal line, and further reducing the dynamic power consumption P of the clock signal line.

Figure 3C:
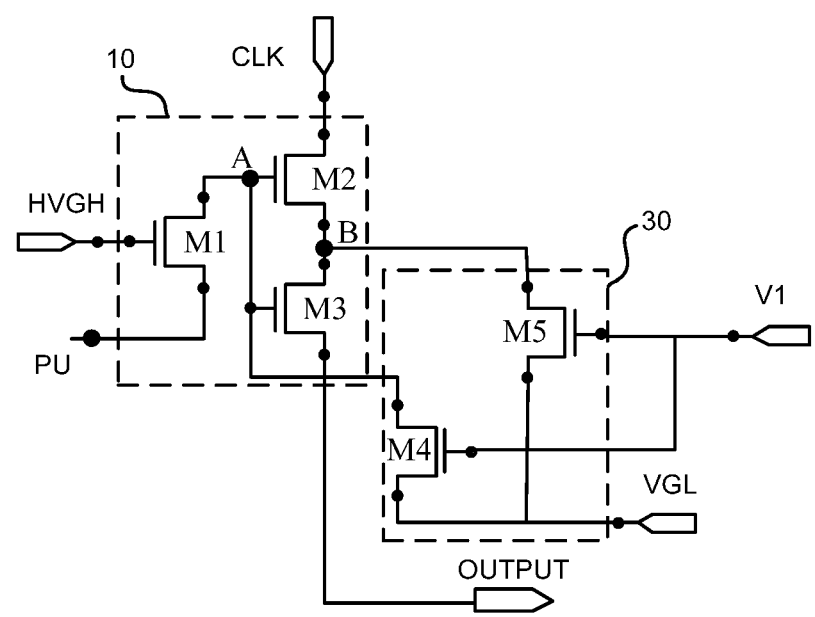
FIG. 3C is a schematic diagram showing a structure of yet another shift register circuit in accordance with some embodiments.

Referring to FIG. 3C, in the first output sub-circuit 10, the second electrode of the first transistor M1, the control electrode of the second transistor M2, and the control electrode of the third transistor M3 are coupled to form a first node A, and the second electrode of the second transistor M2 and the first electrode of the third transistor M3 are coupled to form a second node B. When the first transistor M1 is turned off, the first node A and the second node B are in a floating state. In order to reduce the noise of the first node A and the second node B, in some possible designs, the shift register circuit SR further includes a first noise reduction sub-circuit 30, and the first noise reduction sub-circuit 30 is coupled to a first noise reduction signal terminal V1, a power supply voltage signal terminal VGL and the first output sub-circuit 10. Herein, the first noise reduction signal terminal V1 is configured to output a first noise reduction signal $v_1$, and the power supply voltage signal terminal VGL is configured to output a power supply voltage signal Vgl. The first noise reduction sub-circuit 30 is configured to be turned on under control of the first noise reduction signal $v_1$, and outputs the power supply voltage signal Vgl to the first output sub-circuit 10 to denoise the potential of the first node A and the potential of the second node B.

In a case where the first output sub-circuit 10 includes the first transistor M1, the second transistor M2, and the third transistor M3, for example, as shown in FIG. 3C, the first noise reduction sub-circuit 30 includes a fourth transistor M4 and a fifth transistor M5.

Herein, a control electrode of the fourth transistor M4 is coupled to the first noise reduction signal terminal V1, a first electrode of the fourth transistor M4 is coupled to the power supply voltage signal terminal VGL, and a second electrode of the fourth transistor M4 is coupled to the control electrode of the second transistor M2 and the control electrode of the third transistor M3. The fourth transistor M4 is turned on under control of the first noise reduction signal $v_1$, and outputs the power supply voltage signal Vgl to the control electrode of the second transistor M2 and the control electrode of the third transistor M3 to denoise the potential of the first node A.

A control electrode of the fifth transistor M5 is coupled to the first noise reduction signal terminal V1, a first electrode of the fifth transistor M5 is coupled to the power supply voltage signal terminal VGL, and a second electrode of the fifth transistor M5 is coupled to the second electrode of the second transistor M2 and the first electrode of the third transistor M3. The fifth transistor M5 is turned on under control of the first noise reduction signal $v_1$, and outputs the power supply voltage signal Vgl to the second electrode of the second transistor M2 and the first electrode of the third transistor M3 to denoise the potential of the second node B.

Figure 4A:
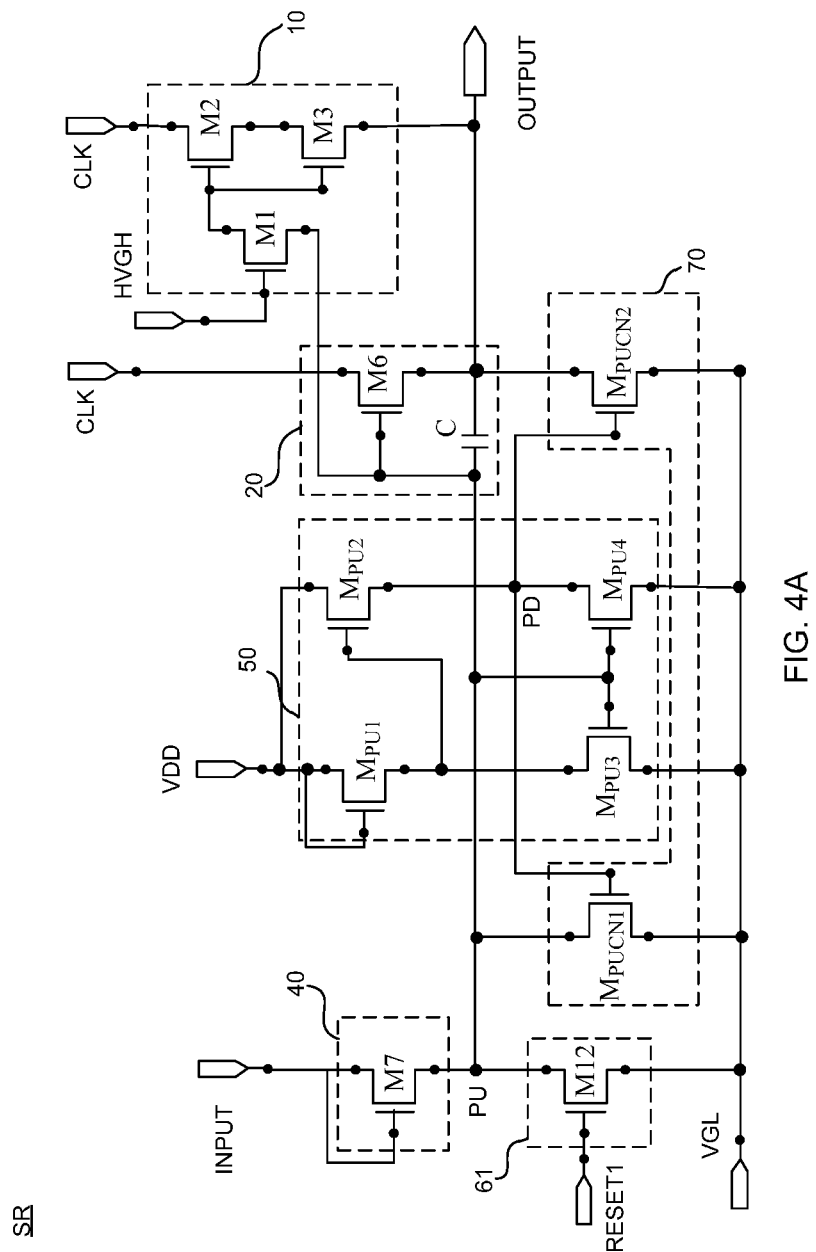
FIG. 4A is a schematic diagram showing a structure of yet another shift register circuit in accordance with some embodiments.
Figure 4B:
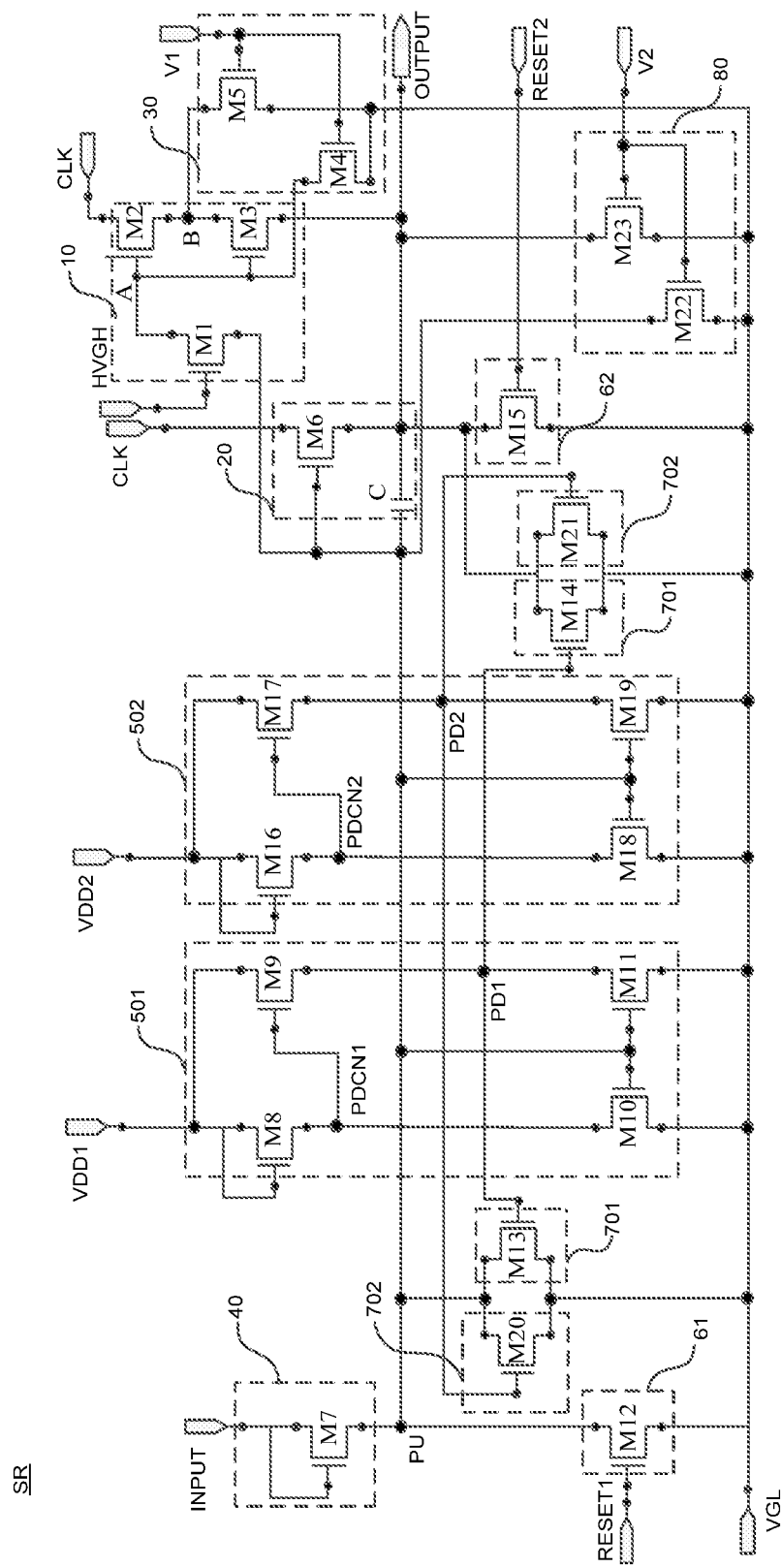
FIG. 4B is a schematic diagram showing a structure of yet another shift register circuit, in accordance with some embodiments.

In some embodiments, as shown in FIG. 4A and FIG. 4B, the second output sub-circuit 20 includes a sixth transistor M6 and a capacitor C.

A control electrode of the sixth transistor M6 is coupled to the pull-up node PU, a first electrode of the sixth transistor M6 is coupled to the clock signal terminal CLK, and a second electrode of the sixth transistor M6 is coupled to the output signal terminal OUTPUT. The sixth transistor M6 is turned on under control of the potential of the pull-up node PU to output the clock signal Clk to the output signal terminal OUTPUT.

One end of the capacitor C is coupled to the pull-up node PU, and another end of the capacitor C is coupled to the output signal terminal OUTPUT. The capacitor C is configured to store the potential of the pull-up node PU during the input stage of the driving process of the shift register circuit SR, or outputs voltage to the pull-up node PU during the output stage of the driving process of the shift register circuit SR.

Figure 2A:
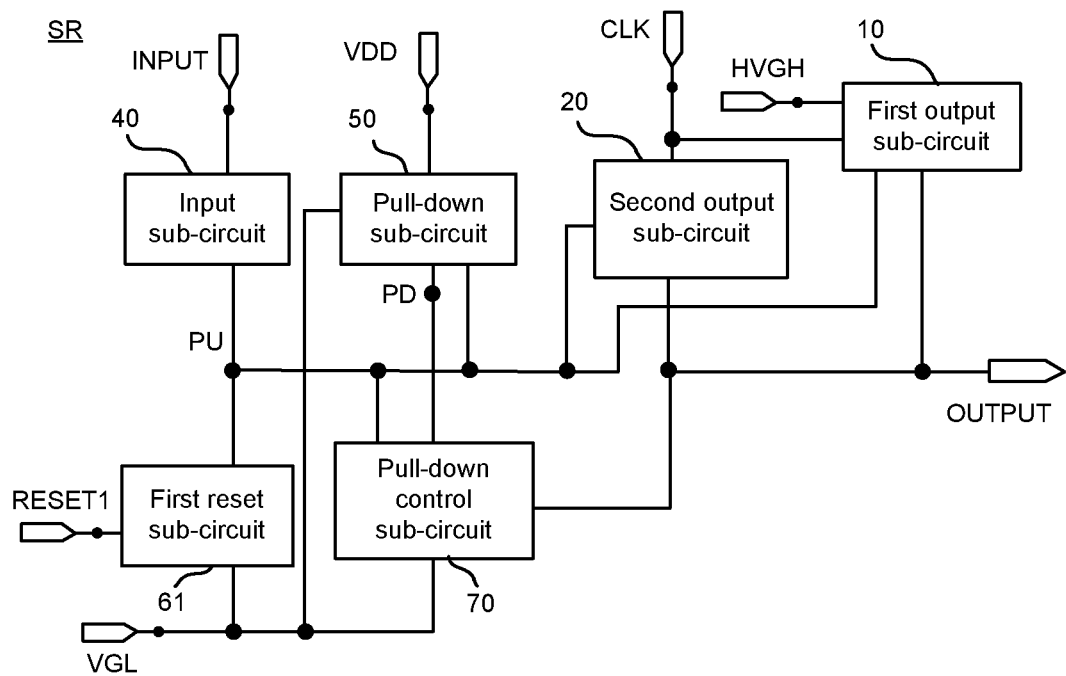
FIG. 2A is a schematic diagram showing a structure of another shift register circuit in accordance with some embodiments.
Figure 2B:
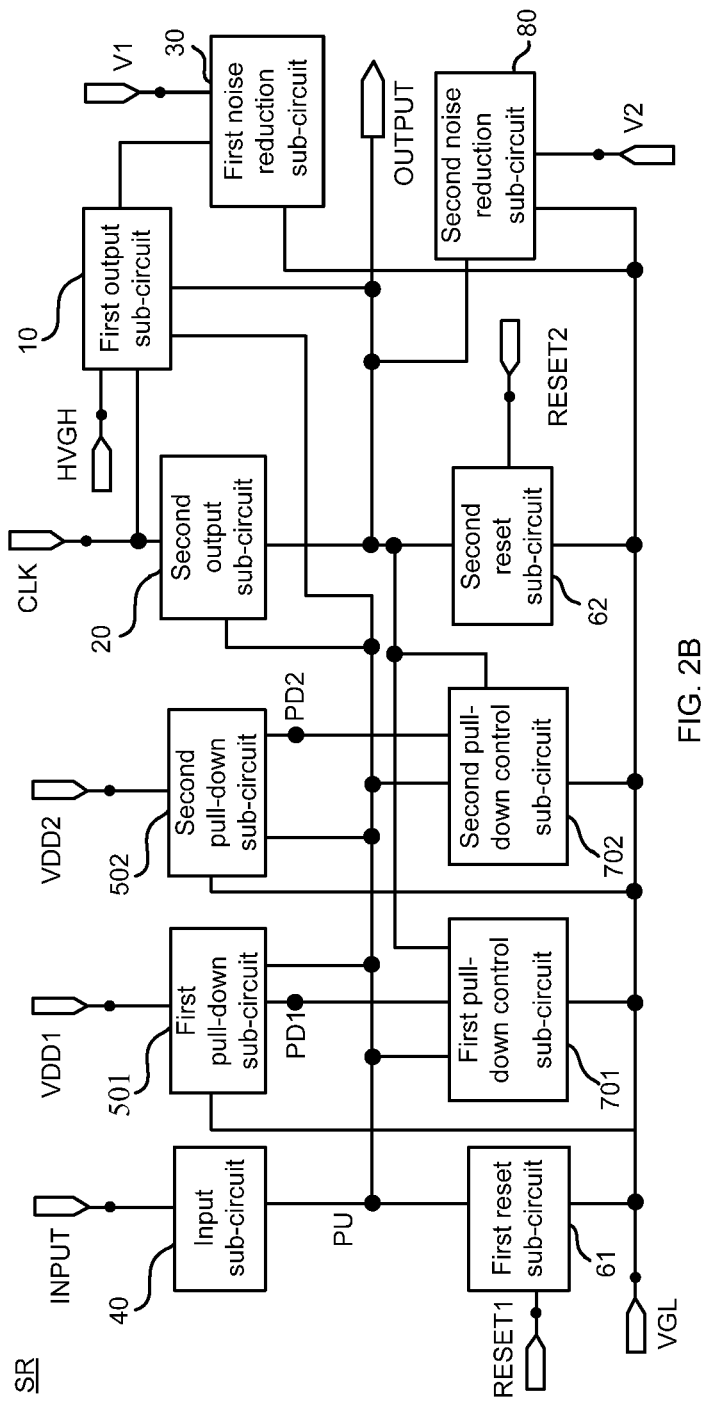
FIG. 2B is a schematic diagram showing a structure of yet another shift register circuit in accordance with some embodiments.

In some embodiments, as shown in FIG. 2A and FIG. 2B, the shift register circuit SR further includes an input sub-circuit 40, at least one pull-down sub-circuit 50, a first reset sub-circuit 61, and at least one pull-down control sub-circuit 70.

Herein, the input sub-circuit 40 is coupled to the input signal terminal INPUT and the pull-up node PU respectively, the input signal terminal INPUT is configured to output an input signal Input, and the input sub-circuit 40 is configured to be turned on under control of the input signal Input to output the input signal Input to the pull-up node PU.

Each pull-down sub-circuit 50 is coupled to a corresponding pull-down voltage signal terminal VDD, the pull-up node PU, a corresponding pull-down node PD, and the power supply voltage signal terminal VGL. Herein, the corresponding pull-down voltage signal terminal VDD is configured to output a corresponding pull-down voltage signal Vdd, and the power supply voltage signal terminal VGL is configured to output the power supply voltage signal Vgl. Each pull-down sub-circuit 50 is configured to be turned on under control of the corresponding pull-down voltage signal Vdd to output the corresponding pull-down voltage signal Vdd to the corresponding pull-down node PD. Or, each pull-down sub-circuit 50 is configured to be turned on under control of the potential of the pull-up node PU to output the power supply voltage signal Vgl to the corresponding pull-down node PD.

The first reset sub-circuit 61 is coupled to a first reset signal terminal RESET1, the pull-up node PU, and the power supply voltage signal terminal VGL. Herein, the first reset signal terminal RESET1 is configured to output a first reset signal $Reset_1$. A first reset sub-circuit 601 is configured to be turned on under control of the first reset signal $Reset_1$ to output the power supply voltage signal Vgl to the pull-up node PU.

Each pull-down control sub-circuit 70 is coupled to the pull-up node PU, the corresponding pull-down node PD, the output signal terminal OUTPUT, and the power supply voltage signal terminal VGL. Each pull-down control sub-circuit 70 is configured to be turned on under control of the potential of the corresponding pull-down node PD to output the power supply voltage signal Vgl to the pull-up node PU and the output signal terminal OUTPUT.

The at least one pull-down sub-circuit 50 is configured to be turned on in sequence, and only one pull-down sub-circuit 50 is configured to be turned on during the same time period. The pull-down sub-circuit 50 and the pull-down control sub-circuit 70 coupled to the same pull-down node PD are configured to be simultaneously turned on or turned off. In this way, the at least one pull-down sub-circuit 50 operates alternately to avoid using the same pull-down sub-circuit 50 for a long time, thereby reducing the probability of damage of the transistor in each pull-down sub-circuit 50 and improving the working life of the shift register circuit SR.

For example, as shown in FIG. 4A, the input sub-circuit 40 includes: a seventh transistor M7. A control electrode and a first electrode of the seventh transistor M7 are coupled to the input signal terminal INPUT, and a second electrode of the seventh transistor M7 is coupled to the pull-up node PU. The seventh transistor M7 is turned on under control of the input signal Input to output the input signal Input to the pull-up node PU.

Each pull-down sub-circuit 50 includes a first pull-down transistor $M_{PU1}$, a second pull-down transistor $M_{PU2}$, a third pull-down transistor $M_{PU3}$, and a fourth pull-down transistor $M_{PU4}$.

Herein, a control electrode and a first electrode of the first pull-down transistor $M_{PU1}$ are coupled to the corresponding pull-down voltage signal terminal VDD, and a second electrode of the first pull-down transistor $M_{PU1}$ is coupled to a control electrode of the second pull-down transistor $M_{PU2}$. The first pull-down transistor $M_{PU1}$ is turned on under control of the pull-down voltage signal Vdd to output the pull-down voltage signal Vdd to the control electrode of the second pull-down transistor $M_{PU2}$.

A first electrode of the second pull-down transistor $M_{PU2}$ is coupled to the corresponding pull-down voltage signal terminal VDD, and a second electrode of the second pull-down transistor $M_{PU2}$ is coupled to the corresponding pull-down node PD. The second pull-down transistor $M_{PU2}$ is turned on under control of the pull-down voltage signal Vdd to output the pull-down voltage signal Vdd to the corresponding pull-down node PD.

A control electrode of the third pull-down transistor $M_{PU3}$ is coupled to the pull-up node PU, a first electrode of the third pull-down transistor $M_{PU3}$ is coupled to the power supply voltage signal terminal VGL, and a second electrode of the third pull-down transistor $M_{PU3}$ is coupled to the control electrode of the second pull-down transistor $M_{PU2}$. The third pull-down transistor $M_{PU3}$ is turned on under control of the potential of the pull-up node PU to output the power supply voltage signal Vgl to the control electrode of the second pull-down transistor $M_{PU2}$.

A control electrode of the fourth pull-down transistor $M_{PU4}$ is coupled to the pull-up node PU, and a first electrode of the fourth pull-down transistor $M_{PU4}$ is coupled to the power supply voltage signal terminal VGL, and a second electrode of the fourth pull-down transistor $M_{PU4}$ is coupled to the corresponding pull-down node PD. The fourth pull-down transistor $M_{PU4}$ is turned on under control of the potential of the pull-up node PU to output the power supply voltage signal Vgl to the corresponding pull-down node PD.

The first reset sub-circuit 61 includes a twelfth transistor M12. A control electrode of the twelfth transistor M12 is coupled to the first reset signal terminal RESET1, a first electrode of the twelfth transistor M12 is coupled to the power supply voltage signal terminal VGL, and a second electrode of the twelfth transistor M12 is coupled to the pull-up node PU. The twelfth transistor M12 is turned on under control of the first reset signal $Reset_1$ to output the power supply voltage signal Vgl to the pull-up node PU.

Each pull-down control sub-circuit 70 includes a first pull-down control transistor $M_{PUCN1}$ and a second pull-down control transistor $M_{PUCN2}$.

Herein, a control electrode of the first pull-down control transistor $M_{PUCN1}$ is coupled to the corresponding pull-down node PD, a first electrode of the first pull-down control transistor $M_{PUCN1}$ is coupled to the power supply voltage signal terminal VGL, and a second electrode of the first pull-down control transistor $M_{PUCN1}$ is coupled to the pull-up node PU. The first pull-down control transistor $M_{PUCN1}$ is turned on under control of the potential of the corresponding pull-down node PD to output the power supply voltage signal Vgl to the pull-up node PU.

A control electrode of the second pull-down control transistor $M_{PUCN2}$ is coupled to the corresponding pull-down node PD, a first electrode of the second pull-down control transistor $M_{PUCN2}$ is coupled to the power supply voltage signal terminal VGL, and a second electrode of the second pull-down control transistor $M_{PUCN2}$ is coupled to the output signal terminal OUTPUT. The second pull-down control transistor $M_{PUCN2}$ is turned on under control of the potential of the corresponding pull-down node PD and outputs the power supply voltage signal Vgl to the output signal terminal OUTPUT to reset the gate line scanning signal output via the output signal terminal OUTPUT, thereby achieving the purpose of denoising the gate line scanning signal of the output signal terminal OUTPUT.

In some embodiments, as shown in FIG. 2B, the at least one pull-down sub-circuit 50 includes a first pull-down sub-circuit 501 and a second pull-down sub-circuit 502. The at least one pull-down control sub-circuit 70 includes a first pull-down control sub-circuit 701 and a second pull-down control sub-circuit 702. The pull-down node PD includes a first pull-down node PD1 and a second pull-down node PD2.

Herein, the first pull-down sub-circuit 501 is coupled to the first pull-down node PD1, and is also coupled to a first pull-down voltage signal terminal VDD1. The first pull-down voltage signal terminal VDD1 is configured to output a first pull-down voltage signal $Vdd_1$. The second pull-down sub-circuit 502 is coupled to the second pull-down node PD2, and is also coupled to a second pull-down voltage signal terminal VDD2. The second pull-down voltage signal terminal VDD2 is configured to output a second pull-down voltage signal $Vdd_2$.

The first pull-down control sub-circuit 701 is coupled to the first pull-down node PD1, and the second pull-down control sub-circuit 702 is coupled to the second pull-down node PD2.

The first pull-down sub-circuit 501 and the second pull-down sub-circuit 502 are configured to be alternately turned on or turned off, and the first pull-down control sub-circuit 701 and the second pull-down control sub-circuit 702 are configured to be alternately turned on or turned off. The first pull-down sub-circuit 501 and the first pull-down control sub-circuit 701 are configured to be simultaneously turned on or turned off, and the second pull-down sub-circuit and the second pull-down control sub-circuit 702 are configured to be simultaneously turned on or turned off. In this way, the first pull-down sub-circuit 501 and the second pull-down sub-circuit 502 operate alternately to avoid using the same pull-down sub-circuit for a long time, thereby reducing the probability of damage of the transistor in each pull-down sub-circuit and increasing the working life of the shift register circuit SR.

The first pull-down sub-circuit 501 and the second pull-down sub-circuit 502 are alternately turned on to operate, that is, after the first pull-down sub-circuit 501 is turned on for a period of time, the second pull-down sub-circuit 502 is switched to be turned on for a period of time, and then cycling in order. For example, the duration of the first pull-down sub-circuit 501 and the second pull-down sub-circuit 502 alternately turned on for operation may be 2 s, 4 s, 6 s, or any other time period.

Figure 7:
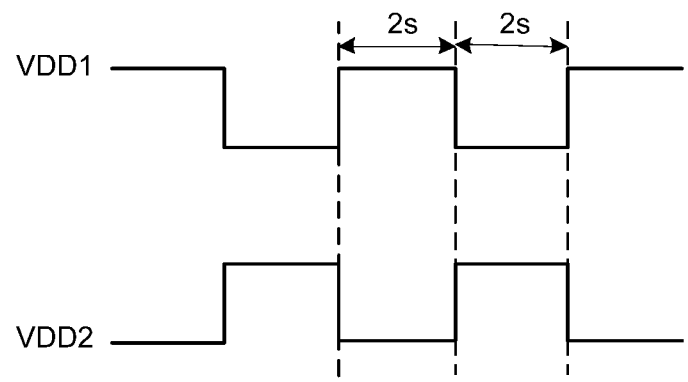
FIG. 7 is a timing signal diagram of a pull-down voltage terminal of a gate driving circuit in accordance with some embodiments.

For example, as shown in FIG. 7, the high level of the first pull-down voltage signzal Vdd1 received by the first pull-down sub-circuit 501 and the high level of the second pull-down voltage signal Vdd2 received by the second pull-down sub-circuit 502 are appeared alternatively, and the duration of the high level of the first pull-down voltage signal Vdd1 and the duration of the high level of the second pull-down voltage signal Vdd2 are 2 s, that is, after the first pull-down sub-circuit 501 is turned on for 2 s, the second pull-down sub-circuit 502 is switched to be turned on for 2 s, and then cycling in order. Therefore, the alternate operation of the first pull-down sub-circuit 501 and the second pull-down sub-circuit 502 can be realized.

For example, as shown in FIG. 4B, the first pull-down sub-circuit 501 includes an eighth transistor M8, a ninth transistor M9, a tenth transistor M10, and an eleventh transistor M11. The second pull-down sub-circuit 502 includes a sixteenth transistor M16, a seventeenth transistor M17, an eighteenth transistor M18, and a nineteenth transistor M19. The first pull-down control sub-circuit 701 includes a thirteenth transistor M13 and a fourteenth transistor M14. The second pull-down control sub-circuit 702 includes a twentieth transistor M20 and a twenty-first transistor M21.

Herein, the eighth transistor M8 serves as a first pull-down transistor $M_{PU1}$ of the first pull-down sub-circuit 501. The ninth transistor M9 serves as a second pull-down transistor $M_{PU2}$ of the first pull-down sub-circuit 501. The tenth transistor M10 serves as a third pull-down transistor $M_{PU3}$ of the first pull-down sub-circuit 501. The eleventh transistor M11 serves as a fourth pull-down transistor $M_{PU4}$ of the first pull-down sub-circuit 501. The coupling relationship among the eighth transistor M8, the ninth transistor M9, the tenth transistor M10, and the eleventh transistor M11 can refer to the above description related to the coupling relationship among the first pull-down transistor $M_{PU1}$, the second pull-down transistor $M_{PU2}$, the third pull-down transistor $M_{PU3}$, and the fourth pull-down transistor $M_{PU4}$ of the pull-down sub-circuit 50.

In the second pull-down sub-circuit 502, the sixteenth transistor M16 serves as a first pull-down transistor $M_{PU1}$ of the second pull-down sub-circuit 502. The seventeenth transistor M17 serves as a second pull-down transistor $M_{PU2}$ of the second pull-down sub-circuit 502. The eighteenth transistor M18 serves as a third pull-down transistor $M_{PU3}$ of the second pull-down sub-circuit 502. The nineteenth transistor M19 serves as a fourth pull-down transistor $M_{PU4}$ of the second pull-down sub-circuit 502. The coupling relationship among the sixteenth transistor M16, the seventeenth transistor M17, the eighteenth transistor M18, and the nineteenth transistor M19 can refer to the above description related to the coupling relationship among the first pull-down transistor $M_{PU1}$, the second pull-down transistor $M_{PU2}$, the third pull-down transistor $M_{PU3}$, and the fourth pull-down transistor $M_{PU4}$ of the pull-down sub-circuit 50.

In the first pull-down control sub-circuit 701, the thirteenth transistor M13 serves as a first pull-down control transistor $M_{PUCN1}$ of the first pull-down control sub-circuit 701. The fourteenth transistor M14 serves as a second pull-down control transistor $M_{PUCN2}$ of the first pull-down control sub-circuit 701. The coupling relationship between the thirteenth transistor M13 and the fourteenth transistor M14 can refer to the above description related to the coupling relationship between the first pull-down control transistor $M_{PUCN1}$ and the second pull-down control transistor $M_{PUCN2}$ of the pull-down control sub-circuit 70.

In the second pull-down control sub-circuit 702, the twentieth transistor M20 serves as a first pull-down control transistor $M_{PUCN1}$ of the second pull-down control sub-circuit 702. The twenty-first transistor M21 serves as a second pull-down control transistor $M_{PUCN2}$ of the second pull-down control sub-circuit 702. The coupling relationship between the twentieth transistor M20 and the twenty-first transistor M21 can refer to the above description related to the coupling relationship between the first pull-down control transistor $M_{PUCN1}$ and the second pull-down control transistor $M_{PUCN2}$ of the pull-down control sub-circuit 70.

In some embodiments, as shown in FIG. 2B, the shift register circuit SR further includes a second reset sub-circuit 62. The second reset sub-circuit 62 is coupled to a second reset signal terminal RESET2, the output signal terminal OUTPUT, and the power supply voltage signal terminal VGL. The second reset signal terminal RESET2 is configured to output an output second reset signal $Reset_2$. The second reset sub-circuit 62 is configured to be turned on under control of the second reset signal $Reset_2$ and outputs the power supply voltage signal Vgl to the output signal terminal OUTPUT to reset the gate line scanning signal of the output signal terminal OUTPUT, thereby achieving the purpose of noise reduction of the gate line scanning signal of the output signal terminal OUTPUT.

For example, as shown in FIG. 4B, the second reset sub-circuit 62 includes a fifteenth transistor M15. The control electrode of the fifteenth transistor M15 is coupled to the second reset signal terminal RESET2, the first electrode of the fifteenth transistor M15 is coupled to the power supply voltage signal terminal VGL, and the second electrode of the fifteenth transistor M15 is coupled to the output signal terminal OUTPUT. The fifteenth transistor M15 is turned on under control of the second reset signal $Reset_2$ and outputs the power supply voltage signal Vgl to the output signal terminal OUTPUT to reset the gate line scanning signal of the output signal terminal OUTPUT, thereby achieving the purpose of noise reduction of the gate line scanning signal of the output signal terminal OUTPUT.

In some embodiments, as shown in FIG. 2B, the shift register circuit SR further includes a second noise reduction sub-circuit 80. The second noise reduction sub-circuit 80 is coupled to a second noise reduction signal terminal V2, the power supply voltage signal terminal VGL, the pull-up node PU, and the output signal terminal OUTPUT. The second noise reduction signal terminal V2 is configured to output a second noise reduction signal $v_2$. The second noise reduction sub-circuit 80 is configured to be turned on under control of the second noise reduction signal $v_2$ and outputs the power supply voltage signal Vgl to the pull-up node PU and the output signal terminal OUTPUT to reset the potential of the pull-up node PU and the gate line scanning signal of the output signal terminal OUTPUT, thereby achieving the purpose of noise reduction of the potential of the pull-up node PU and the gate line scanning signal of the output signal terminal OUTPUT.

In some possible designs, the second noise reduction signal terminal V2 and the first noise reduction signal terminal V1 receive the same signals, that is, a second noise reduction signal $v_2$ output via the second noise reduction signal terminal V2 and a first noise reduction signal $v_1$ output via the first noise reduction signal terminal V1 are the same signals. For example, both the second noise reduction signal terminal V2 and the first noise reduction signal terminal V1 receive a frame start signal. In this way, the introduction of new signals can be avoided, thereby simplifying the control process of the shift register circuit SR and simplifying the circuit structure of the gate driving circuit. However, the second noise reduction signal terminal V2 and the first noise reduction signal terminal V1 can also receive different signals, which is not limited herein by the disclosure.

For example, as shown in FIG. 4B, the second noise reduction sub-circuit 80 includes a twenty-second transistor M22 and a twenty-third transistor M23.

The control electrode of the twenty-second transistor M22 is coupled to the second noise reduction signal terminal V2, the first electrode of the twenty-second transistor M22 is coupled to the power supply voltage signal terminal VGL, and the second electrode of the twenty-second transistor M22 is coupled to the pull-up node PU. The twenty-second transistor M22 is turned on under control of the second noise reduction signal $v_2$ and outputs the power supply voltage signal Vgl to the pull-up node PU to reset the potential of the pull-up node PU, thereby achieving the purpose of noise reduction of the potential of the pull-up node PU.

The control electrode of the twenty-third transistor M23 is coupled to the second noise reduction signal terminal V2, the first electrode of the twenty-third transistor M23 is coupled to the power supply voltage signal terminal VGL, and the second electrode of the twenty-third transistor M23 is coupled to the output signal terminal OUTPUT. The twenty-third transistor M23 is turned on under control of the second noise reduction signal $v_2$ and outputs the power supply voltage signal Vgl to the output signal terminal OUTPUT to reset the gate line scanning signal of the output signal terminal OUTPUT, thereby achieving the purpose of noise reduction of the gate line scanning signal of the output signal terminal OUTPUT.

The specific circuit structure of the shift register circuit SR provided by the embodiments of the present disclosure will be illustratively described below.

As shown in FIG. 4B, in some embodiments, the shift register circuit SR includes the first output sub-circuit 10, the second output sub-circuit 20, the pull-up node PU, the input sub-circuit 40, the first pull-down sub-circuit 501, the first reset sub-circuit 601, the first pull-down control sub-circuit 701, and the first pull-down node PD.

The first output sub-circuit 10 includes the first transistor M1, the second transistor M2, and the third transistor M3.

Herein, the control electrode of the first transistor M1 is coupled to the control signal terminal HVGH, the first electrode of the first transistor M1 is coupled to the pull-up node PU, and the second electrode of the first transistor M1 is coupled to the control electrode of the second transistor M2 and the control electrode of the third transistor M3. The first transistor M1 is turned on under control of the control signal Hvgh to output the potential of the pull-up node PU to the control electrode of the second transistor M2 and the control electrode of the third transistor M3.

The first electrode of the second transistor M2 is coupled to the clock signal terminal CLK, and the second electrode of the second transistor M2 is coupled to the first electrode of the third transistor M3. When the first transistor M1 outputs the potential of the pull-up node PU to the control electrode of the second transistor M2, the second transistor M2 is turned on under control of the potential of the pull-up node PU to output the clock signal Clk to the third electrode of the third transistor M3.

The second electrode of the third transistor M3 is coupled to the output signal terminal OUTPUT. When the first transistor M1 outputs the potential of the pull-up node PU to the control electrode of the third transistor M3, the third transistor M3 is turned on under control of the potential of the pull-up node PU to output the clock signal Clk output via the second transistor M2 to the output signal terminal OUTPUT.

The second output sub-circuit 20 includes the sixth transistor M6 and the capacitor C.

Herein, the control electrode of the sixth transistor M6 is coupled to the pull-up node PU, the first electrode of the sixth transistor M6 is coupled to the clock signal terminal CLK, and the second electrode of the sixth transistor M6 is coupled to the output signal terminal OUTPUT. The sixth transistor M6 is turned on under control of the potential of the pull-up node PU to output the clock signal Clk to the output signal terminal OUTPUT.

One end of the capacitor C is coupled to the pull-up node PU, and another end of the capacitor C is coupled to the output signal terminal OUTPUT. The capacitor C stores the potential of the pull-up node PU during the input stage of the driving process of the shift register circuit SR, or outputs voltage to the pull-up node PU during the output stage of the driving process of the shift register circuit SR.

The input sub-circuit 40 includes the seventh transistor M7. The control electrode and the first electrode of the seventh transistor are coupled to the input signal terminal INPUT, and the second electrode of the seventh transistor M7 is coupled to the pull-up node PU. The seventh transistor M7 is turned on under control of the input signal Input to output the input signal Input to the pull-up node PU.

The first pull-down sub-circuit 501 includes an eighth transistor M8, a ninth transistor M9, a tenth transistor M10, and an eleventh transistor M11.

Herein, A control electrode and a first electrode of the eighth transistor M8 are coupled to the first pull-down voltage signal terminal VDD1, and a second electrode of the eighth transistor M8 is coupled to the control electrode of the ninth transistor M9. The eighth transistor M8 is turned on under control of the first pull-down voltage signal $Vdd_1$ to output the first pull-down voltage signal $Vdd_1$ to the control electrode of the ninth transistor M9.

A first electrode of the ninth transistor M9 is coupled to the first pull-down voltage signal terminal VDD1, and a second electrode of the ninth transistor M9 is coupled to the first pull-down node PD1. The ninth transistor M9 is turned on under control of the first pull-down voltage signal $Vdd_1$ to output the first pull-down voltage signal $Vdd_1$ to the first pull-down node PD1.

A control electrode of the tenth transistor M10 is coupled to the pull-up node PU, a first electrode of the tenth transistor M10 is coupled to the power supply voltage signal terminal VGL, and a second electrode of the tenth transistor M10 is coupled to the control electrode of the ninth transistor M9. The tenth transistor M10 is turned on under control of the potential of the pull-up node PU to output the power supply voltage signal Vgl to the control electrode of the ninth transistor M9.

A control electrode of the eleventh transistor M11 is coupled to the pull-up node PU, a first electrode of the eleventh transistor M11 is coupled to the power supply voltage signal terminal VGL, and a second electrode of the eleventh transistor M11 is coupled to the first pull-down node PD1. The eleventh transistor M11 is turned on under control of the potential of the pull-up node PU to output the power supply voltage signal Vgl to the first pull-down node PD1.

Here, as shown in FIG. 4B, the second electrode of the eighth transistor M8 is coupled to the second electrode of the tenth transistor M10. The second electrode of the eighth transistor M8, the control electrode of the ninth transistor M9, and the second electrode of the tenth transistor M10 are coupled to form a first pull-down control node PDCN1.

The first reset sub-circuit 61 includes a twelfth transistor M12. A control electrode of the twelfth transistor M12 is coupled to the first reset signal terminal RESET1, a first electrode of the twelfth transistor M12 is coupled to the power supply voltage signal terminal VGL, and a second electrode of the twelfth transistor M12 is coupled to the pull-up node PU. The twelfth transistor M12 is turned on under control of the first reset signal $Reset_1$ to output the power supply voltage signal Vgl to the pull-up node PU.

The first pull-down control sub-circuit 701 includes the thirteenth transistor M13 and the fourteenth transistor M14.

Herein, a control electrode of the thirteenth transistor M13 is coupled to the first pull-down node PD1, a first electrode of the thirteenth transistor M13 is coupled to the power supply voltage signal terminal VGL, and a second electrode of the thirteenth transistor M13 is coupled to the pull-up node PU. The thirteenth transistor M13 is turned on under control of the potential of the first pull-down node PD1 to output the power supply voltage signal Vgl to the pull-up node PU.

A control electrode of the fourteenth transistor M14 is coupled to the first pull-down node PD1, a first electrode of the fourteenth transistor M14 is coupled to the power supply voltage signal terminal VGL, and a second electrode of the fourteenth transistor M14 is coupled to the output signal terminal OUTPUT. The fourteenth transistor M14 is turned on under control of the potential of the first pull-down node PD1 to output the power supply voltage signal Vgl to the output signal terminal OUTPUT.

In other embodiments, as shown in FIG. 4B, the shift register circuit SR further includes the first noise reduction sub-circuit 30, the second reset sub-circuit 62, the second pull-down sub-circuit 502, the second pull-down control sub-circuit 702, the second pull-down node PD2, and the second noise reduction sub-circuit 80.

The first noise reduction sub-circuit 30 includes the fourth transistor M4 and the fifth transistor M5.

Herein, the control electrode of the fourth transistor M4 is coupled to the first noise reduction signal terminal V1, the first electrode of the fourth transistor M4 is coupled to the power supply voltage signal terminal VGL, the second electrode of the fourth transistor M4 is coupled to the control electrode of the second transistor M2 and the control electrode of the third transistor M3. The fourth transistor M4 is turned on under control of the first noise reduction signal $v_1$ and outputs the power supply voltage signal Vgl to the control electrode of the second transistor M2 and the control electrode of the third transistor M3 to denoise the potential of the first node A.

The control electrode of the fifth transistor M5 is coupled to the first noise reduction signal terminal V1, the first electrode of the fifth transistor M5 is coupled to the power supply voltage signal terminal VGL, and the second electrode of the fifth transistor M5 is coupled to the second electrode of the second transistor M2 and the first electrode of the third transistor M3. The fifth transistor M5 is turned on under control of the first noise reduction signal $v_1$ and outputs the power supply voltage signal Vgl to the second electrode of the second transistor M2 and the first electrode of the third transistor M3 to denoise the potential of the second node B.

The second reset sub-circuit 62 includes the fifteenth transistor M15. A control electrode of the fifteenth transistor M15 is coupled to the second reset signal terminal RESET2, a first electrode of the fifteenth transistor M15 is coupled to the power supply voltage signal terminal VGL, and a second electrode of the fifteenth transistor M15 is coupled to the output signal terminal OUTPUT. The fifteenth transistor M15 is turned on under control of the second reset signal $Reset_2$ and outputs the power supply voltage signal Vgl to the output signal terminal OUTPUT to denoise the gate line scanning signal of the output signal terminal OUTPUT.

The second pull-down sub-circuit 502 includes the sixteenth transistor M16, the seventeenth transistor M17, the eighteenth transistor M18, and the nineteenth transistor M19.

Herein, a control electrode and a first electrode of the sixteenth transistor M16 are coupled to a second pull-down voltage signal terminal VDD2, and the second electrode of the sixteenth transistor M16 is coupled to the control electrode of the seventeenth transistor M17. The sixteenth transistor M16 is turned on under control of the second pull-down voltage signal $Vdd_2$ to output the second pull-down voltage signal $Vdd_2$ to the control electrode of the seventeenth transistor M17.

A first electrode of the seventeenth transistor M17 is coupled to the second pull-down voltage signal terminal VDD2, and a second electrode of the seventeenth transistor M17 is coupled to the second pull-down node PD2. The seventeenth transistor M17 is turned on under control of the second pull-down voltage signal $Vdd_2$ to output the second pull-down voltage signal $Vdd_2$ to the second pull-down node PD2.

A control electrode of the eighteenth transistor M18 is coupled to the pull-up node PU, a first electrode of the eighteenth transistor M18 is coupled to the power supply voltage signal terminal VGL, and a second electrode of the eighteenth transistor M18 is coupled to the control electrode of the seventeenth transistor M17. The eighteenth transistor M18 is turned on under control of the potential of the pull-up node PU to output the power supply voltage signal Vgl to the control electrode of the seventeenth transistor M17.

A control electrode of the nineteenth transistor M19 is coupled to the pull-up node PU, a first electrode of the nineteenth transistor M19 is coupled to the power supply voltage signal terminal VGL, and a second electrode of the nineteenth transistor M19 is coupled to the second pull-down node PD2. The nineteenth transistor M19 is turned on under control of the potential of the pull-up node PU to output the power supply voltage signal Vgl to the second pull-down node PD2.

Here, as shown in FIG. 4B, the second electrode of the sixteenth transistor M16 is coupled to the second electrode of the eighteenth transistor M18. The second electrode of the sixteenth transistor M16, the control electrode of the seventeenth transistor M17, and the second electrode of the eighteenth transistor M18 are coupled to form a second pull-down control node PDCN2.

The second pull-down control sub-circuit 702 includes the twentieth transistor M20 and the twenty-first transistor M21.

Herein, a control electrode of the twentieth transistor M20 is coupled to the second pull-down node PD2, a first electrode of the twentieth transistor M20 is coupled to the power supply voltage signal terminal VGL, and a second electrode of the twentieth transistor M20 is coupled to the pull-up node PU. The twentieth transistor M20 is turned on under control of the potential of the second pull-down node PD2 to output the power supply voltage signal Vgl to the pull-up node PU.

A control electrode of the twenty-first transistor M21 is coupled to the second pull-down node PD2, a first electrode of the twenty-first transistor M21 is coupled to the power supply voltage signal terminal VGL, and a second electrode of the twenty-first transistor M21 is coupled to the output signal terminal OUTPUT. The twenty-first transistor M21 is turned on under control of the potential of the second pull-down node PD2 to output the power supply voltage signal Vgl to the output signal terminal OUTPUT.

The second noise reduction sub-circuit 80 includes the twenty-second transistor M22 and the twenty-third transistor M23.

Herein, a control electrode of the twenty-second transistor M22 is coupled to the second noise reduction signal terminal V2, a first electrode of the twenty-second transistor M22 is coupled to the power supply voltage signal terminal VGL, and a second electrode of the twenty-second transistor M22 is coupled to the pull-up node PU. The twenty-second transistor M22 is turned on under control of the second noise reduction signal $v_2$ and outputs the power supply voltage signal Vgl to the pull-up node PU to denoise the potential of the pull-up node PU.

A control electrode of the twenty-third transistor M23 is coupled to the second noise reduction signal terminal V2, a first electrode of the twenty-third transistor M23 is coupled to the power supply voltage signal terminal VGL, and a second electrode of the twenty-third transistor M23 is coupled to the output signal terminal OUTPUT. The twenty-third transistor M23 is turned on under control of the second noise reduction signal $v_2$ and outputs the power supply voltage signal Vgl to the output signal terminal OUTPUT to denoise the gate line scanning signal of the output signal terminal OUTPUT.

In some embodiments, the shift register circuit SR can also include three pull-down sub-circuits 50, three pull-down control sub-circuits 70, and three pull-down nodes PD. Each pull-down sub-circuit 50 and each pull-down control sub-circuit 70 are coupled to a corresponding pull-down node PD, and different pull-down sub-circuits 50 and pull-down control sub-circuits 70 are coupled to different pull-down nodes PD. For the specific connection manner, refer to the description of the related content above, which will not be described herein again.

Here, in the above three pull-down sub-circuits 50, each pull-down sub-circuit 50 corresponds to a pull-down voltage terminal VDD, and different pull-down sub-circuits 50 correspond to different pull-down voltage terminals VDD.

It will be noted that, in some embodiments, the control electrode of each transistor mentioned in the present disclosure is the gate of the transistor. The first electrode of the transistor is the source, and the second electrode of the transistor is the drain. Or, the first electrode of the transistor is the drain, and the second electrode of the transistor is the source. Each transistor can be an N-type transistor or a P-type transistor, which is not limited by the embodiments of the present disclosure.

Figure 5:
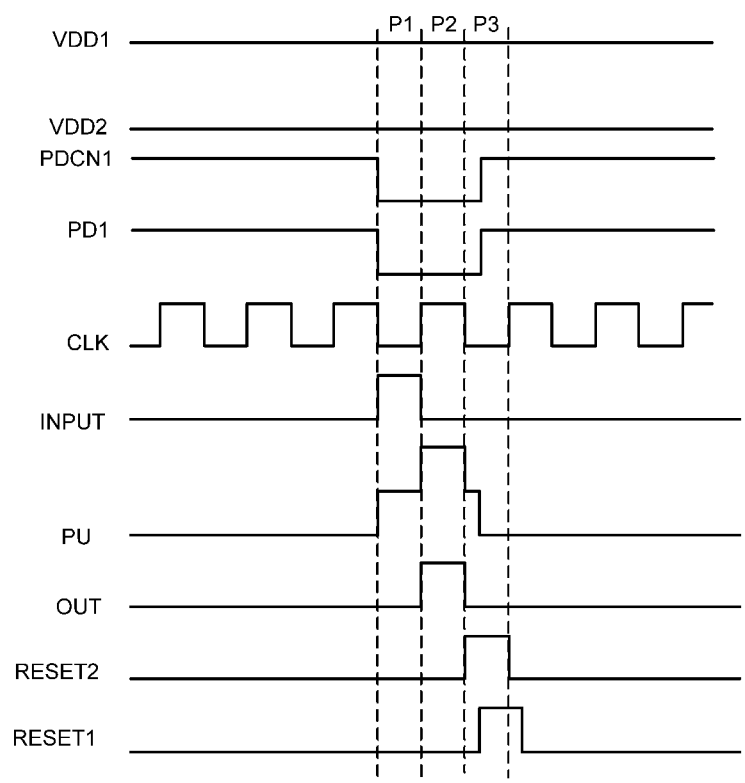
FIG. 5 is a timing diagram of control signals of a shift register circuit in accordance with some embodiments.

Taking the transistors in the shift register circuit SR as N-type transistors as an example, the following is described in conjunction with the timing signal diagram shown in FIG. 5 and the working process of the display apparatus operating in a state where the operating temperature is lower than the preset operating temperature or the refresh frequency is higher than the preset refresh frequency. The following description uses "1" for high level and "0" for low level.

In the above case where the operating temperature is lower than the preset operating temperature, or the refresh frequency is greater than the preset refresh frequency, the control signal terminal HVGH receives the control signal Hvgh having first level (taking the first level is high level as an example). Under control of the control signal Hvgh having the first level, the first transistor M1 is turned on, and the potential of the pull-up node PU is output to the first node A.

In an input phase P1, INPUT=1, CLK=0, PU=1, PD1=0, OUT=0, RESET1=0, RESET2=0, and HVGH=1.

Under control of the input signal Input output by the input signal terminal INPUT, the seventh transistor M7 is turned on to output the input signal Input to the pull-up node PU and store the voltage of the input signal Input to the capacitor C. Since the first transistor M1 is turned on, the potential of the pull-up node PU is output to the first node A. Under control of the potential of the first node A, the second transistor M2 and the third transistor M3 are turned on. Under control of the potential of the pull-up node PU, the sixth transistor M6 is turned on. Since the clock signal Clk output by the clock signal terminal CLK is at low level during this stage, the output signal terminal OUTPUT does not output the gate line scan signal.

In addition, under control of the potential of the pull-up node PU, the tenth transistor M10 and the eleventh transistor M11 are turned on. Under control of the potential of the pull-up node PU, the eleventh transistor M11 outputs the power supply voltage signal Vgl to the first pull-down node PD1. Under control of the first pull-down node PD1, the thirteenth transistor M13 and the fourteenth transistor M14 are turned off. Moreover, in a case where the shift register circuit SR includes the fourth transistor M4 and the fifth transistor M5, the fourth transistor M4 and the fifth transistor M5 are turned off under control of the first noise reduction signal $v_1$ output via the first noise reduction signal terminal V1.

In an input phase P2, INPUT=0, CLK=1, PU=1, PD1=0, OUT=1, RESET1=0, RESET2=0, and HVGH=1.

The input signal Input of the input signal terminal INPUT is at low level, and the seventh transistor M7 is turned off. The potential of the pull-up node PU is floating. In this case, the clock signal Clk changes from low potential to high potential, and the sixth transistor M6 is still turned on under control of the potential of the pull-up node PU. The clock signal Clk (high potential) is output to the output signal terminal OUTPUT, and the potential of the end of the capacitor C coupled to the output signal terminal OUTPUT changes from low potential to high potential. Since the capacitor has the characteristic of capacitance bootstrap, the capacitor C discharges the pull-up node PU to maintain the potential of the pull-up node PU at high potential. Under control of the potential of the pull-up node PU, a high-level clock signal Clk output via the clock signal terminal CLK is output to the output signal terminal OUTPUT through the sixth transistor M6.

In this case, if the potential of the pull-up node PU is greater than the high potential of the control signal Hvgh, that is, the voltage difference between the source and the gate of the first transistor M1 is greater than 0, the first transistor M1 will be turned off, so that the first output sub-circuit 10 cannot output the clock signal Clk.

Based on this, in some embodiments, the high potential of the control signal Hvgh is greater than the high potential of the pull-up node PU. Considering the problem that the potential of the pull-up node PU is raised under bootstrap action of the capacitor C in an ideal state, the high potential of the control signal Hvgh is greater than twice the high potential of the pull-up node PU. In this case, the high potential of the pull-up node PU is output to the first node A through the first transistor M1, at this time, the second transistor M2 and the third transistor M3 are turned on, and the high level of the clock signal Clk is output to the output signal terminal OUTPUT through the second transistor M2 and the third transistor M3.

In summary, in this stage, the output transistor includes a second transistor M2, a third transistor M3, and a sixth transistor M6, which is equivalent to increasing the size of the output transistor, thereby enhancing the driving ability of the output signal terminal OUTPUT output the gate line scanning signal.

In a reset phase P3, INPUT=0, CLK=0, PU=0, PD1=1, OUT=0, RESET1=1, RESET2=1, and HVGH=1.

Under control of the first reset signal $Reset_1$ output via the first reset signal terminal RESET1, the twelfth transistor M12 is turned on and outputs the power supply voltage signal Vgl to the pull-up node PU to pull down the potential of the pull-up node PU. Under control of the second reset signal $Reset_2$ output via the second reset signal terminal RESET2, the fifteenth transistor M15 is turned on and outputs the power supply voltage signal Vgl to the output signal terminal OUTPUT to pull down the voltage of the output signal terminal OUTPUT, thereby resetting the pull-up node PU and the output signal terminal OUTPUT.

In a case where the operating temperature of the display apparatus is higher than or equals to the preset operating temperature, and the refresh frequency is less than or equals to the preset refresh frequency, the control signal terminal HVGH receives the control signal Hvgh having second level (the second level is low level), the first transistor M1 is turned off, and the first output sub-circuit 10 does not output the clock signal Clk.

In an input phase P1, INPUT=1, CLK=0, PU=1, PD1=0, OUT=0, RESET1=0, RESET2=0, and HVGH=0. The working process can refer to the above working process of the shift register circuit SR in the input phase P1.

In an input phase P2, INPUT=0, CLK=1, PU=1, PD1=0, OUT=1, RESET1=0, RESET2=0, and HVGH=0.

The input signal Input of the input signal terminal INPUT is at low level, and the seventh transistor M7 is turned off. Since the capacitor has the characteristic of capacitance bootstrap, the capacitor C discharges the pull-up node PU to maintain the potential of the pull-up node PU at high potential. Under control of the potential of the pull-up node PU, the sixth transistor M6 is turned on, and outputs the high-level clock signal Clk to the output signal terminal OUTPUT.

In a reset phase, INPUT=0, CLK=0, PU=0, PD1=1, OUT=0, RESET1=1, RESET2=1, and HVGH=0. The working process can refer to the above working process of the shift register circuit SR in the reset phase P3.

Figure 6:
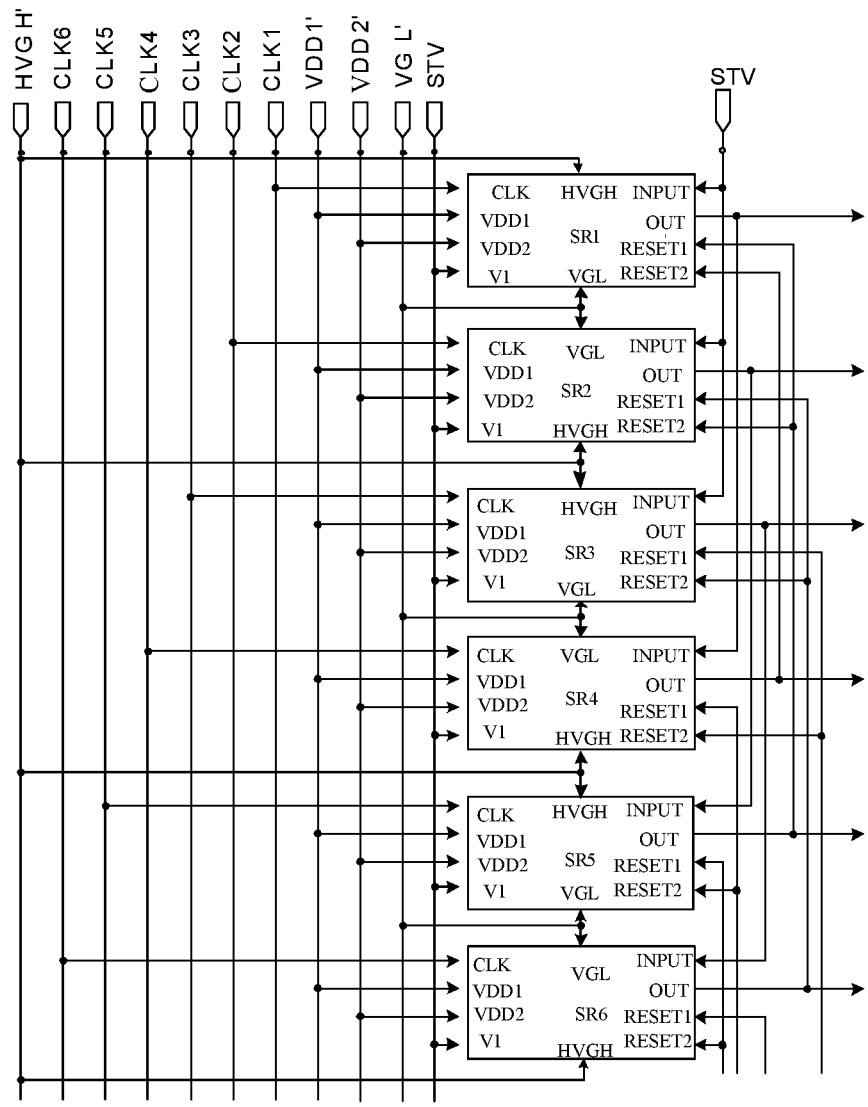
FIG. 6 is a schematic diagram showing a cascaded structure of a gate driving circuit in accordance with some embodiments.

As shown in FIG. 6, some embodiments of the present disclosure provide a gate driving circuit 1 including a plurality of cascaded shift register circuits SR, and each shift register circuit SR is a shift register circuit SR as described above.

In a case where the operating temperature of the display apparatus is lower than a preset operating temperature, or the refresh frequency is greater than a preset refresh frequency, the first output sub-circuit 10 and the second output sub-circuit 20 of each shift register circuit SR of the gate driving circuit 1 operate simultaneously, which is equivalent to increasing the size of the output transistor, thereby enhancing the ability of the gate line scanning signal output via the output signal terminal OUTPUT driving the other stage shift register circuit SR.

Moreover, when the operating temperature of the display apparatus is higher than or equals to the preset operating temperature, or the refresh frequency is less than or equals to the preset refresh frequency, the first output sub-circuit 10 does not operate, and only the second output sub-circuit 20 operates, which is equivalent to reducing the size of the output transistor in the working environment, thereby reducing the noise coupled to the pull-up node PU and saving the power consumption of the clock signal line.

In addition, in a case where the first output sub-circuit 10 includes the second transistor M2 and the third transistor M3, the gate-source capacitance of the output switch transistor coupled to each shift register circuit SR is reduced, which is advantageous for reducing the dynamic loss of the clock signal line.

In some embodiments, as shown in FIG. 6, the gate driving circuit 1 further includes six clock signal lines. Each shift register circuit SR includes the input signal terminal INPUT, the clock signal terminal CLK, the first reset signal terminal RESET1, and the output signal terminal OUTPUT. The plurality of shift register circuits SR included in the gate driving circuit 1 are divided into a plurality of sets of shift register circuits SR, each set of shift register circuits SR includes six adjacent shift register circuits SR, and clock signal terminals CLK of the six shift register circuits SR of each set of shift register circuits SR are coupled to the six clock signal lines in a one to one correspondence.

Herein, input signal terminals INPUT of the first three stages of shift register circuits SR are coupled to a frame start signal terminals STV. Except the first three stages of the shift register circuits SR, the input signal terminal INPUT of the Nth stage shift register circuit SR is coupled to the output signal terminal OUTPUT of the (N−3)th stage shift register circuit SR.

Herein, first reset signal terminals of the last four stages of the shift register circuits SR are coupled to output signal terminals OUTPUT of four stages of dummy shift register circuits in a one to one correspondence, and except the last four stages of the shift register circuits SR, the first reset signal terminal RESET1 of the Nth stage shift register circuit SR is coupled to the output signal terminal OUTPUT of the (N+4)th stage shift register circuit SR.

For example, the six clock signal lines include CLK1, CLK2, CLK3, CLK4, CLK5, and CLK6. The gate driving circuit 1 includes n shift register circuits SR divided into n/6 groups, which are respectively the first group shift register circuit SR to the (n/6)th group shift register circuit SR. Herein, the first group shift register circuit SR includes a first shift register circuit SR1, a second shift register circuit SR2, . . . , a fifth shift register circuit SR5, and a sixth shift register circuit SR6. The (n/6)th group shift register circuit SR includes the (n−5)th shift register circuit SR(n−5), the (n−4)th shift register circuit SR(n−4), . . . , the (n−1)th shift register circuit SR(n−1), and the nth shift register circuit SRn. Herein, n is greater than or equals to 12.

Herein, the first shift register circuit SR1 is coupled to the clock signal line CLK1, the second shift register circuit SR2 is coupled to the clock signal line CLK2, . . . , the fifth shift register circuit SR5 is coupled to the clock signal line CLK5, and the sixth shift register circuit SR6 is coupled to the clock signal line CLK6.

The (n−5)th shift register circuit SR(n−5) is coupled to the clock signal line CLK1, the (n−4)th shift register circuit SR(n−4) is coupled to the clock signal line CLK2, . . . , the (n−1)th shift register circuit SR(n−1) is coupled to the clock signal line CLK5, and the nth shift register circuit SRn is coupled to the clock signal line CLK6.

In some embodiments, as shown in FIG. 6, the gate driving circuit 1 further includes a control signal line HVGH', a first pull-down voltage signal line VDD1', a second pull-down voltage signal line VDD2', and a power supply voltage signal line VGL'. Herein, the control signal line HVGH' is coupled to the control signal terminal HVGH of each stage of the shift register circuit SR. The first pull-down voltage signal line VDD1' is coupled to the first pull-down voltage signal terminal VDD1 of each stage of the shift register circuit SR. The second pull-down voltage signal line VDD2' is coupled to the second pull-down voltage signal terminal VDD2 of each stage of the shift register circuit SR. The power supply voltage signal line VGL' is coupled to the power supply voltage signal terminal VGL of each stage of the shift register circuit SR.

In some embodiments, as shown in FIG. 6, each shift register circuit SR further includes a second reset signal terminal RESET2. The second reset signal terminal RESET2 of the Nth stage shift register circuit SR is coupled to the output signal terminal OUTPUT of the (N+3)th stage shift register circuit SR.

Based on the above structure, for the same stage shift register circuit SR, the first reset signal terminal RESET1 of the shift register circuit SR is coupled to the output signal terminal OUTPUT of the fourth-stage shift register circuit SR after the shift register circuit SR. The second reset signal terminal RESET2 of the shift register circuit SR is coupled to the output signal terminal OUTPUT of the third-stage shift register circuit SR after the shift register circuit SR, that is, the first reset signal Reset$_1$ of the first reset signal terminal RESET1 has output delay with respect to the second reset signal Reset$_2$ of the second reset signal terminal RESET2.

In some embodiments, for the last four stages of the shift register circuits (i.e., the (n−3)th, (n−2)th, (n−1)th and (n)th stage shift register circuit), a mode for providing the first reset signal and the second reset signal for them is: there are additional four stages of dummy shift register circuits configured to provide the first reset signal and second reset signal for the (n−3)th, (n−2)th, (n−1)th and (n)th stage shift register circuit. These four stages of dummy shift register circuits are the (n+1)th, (n+2)th, (n+3)th and (n+4)th stage shift register circuits.

The first reset signal terminal of the (n)th stage shift register circuit is coupled to an output signal terminal of the (n+4)th stage shift register circuit, and the second reset signal terminal of the (n)th stage shift register circuit is coupled to an output signal terminal of the (n+3)th stage shift register circuit.

The first reset signal terminal of the (n−1)th stage shift register circuit is coupled to the output signal terminal of the (n+3)th stage shift register circuit, and the second reset signal terminal of the (n−1)th stage shift register circuit is coupled to an output signal terminal of the (n+2)th stage shift register circuit.

The first reset signal terminal of the (n−2)th stage shift register circuit is coupled to the output signal terminal of the (n+2)th stage shift register circuit, and the second reset signal terminal of the (n−2)th stage shift register circuit is coupled to an output signal terminal of the (n+1)th stage shift register circuit.

The first reset signal terminal of the (n−3)th stage shift register circuit is coupled to the output signal terminal of the (n+1)th stage shift register circuit, and the second reset signal terminal of the (n−3)th stage shift register circuit is coupled to an output signal terminal of the (n)th stage shift register circuit.

In this way, as shown in FIG. 6, when the second reset signal $Reset_2$ denoises the output signal of the output signal terminal OUTPUT, under control of potential of the pull-up node PU, in order to ensure that the signal output via the output signal OUTPUT is at low level, in this case, the second reset signal $Reset_2$ still denoises the output signal of the output signal terminal OUTPUT, which further enhancing the denoising effect on the output signal of the output signal terminal OUTPUT.

In some embodiments, each shift register circuit SR as shown in FIG. 6 further includes a first noise reduction signal terminal V1. The first noise reduction signal terminal V1 of each shift register circuit SR is coupled to the frame start signal terminal STV. In some embodiments, input signal terminals INPUT of the first three stages of shift register circuits SR are also coupled to a frame start signal terminals STV.

In this way, when the operating temperature of the display apparatus is higher than or equals to the preset operating temperature, or the refresh frequency is less than or equals to the preset refresh frequency, the control signal Hvgh is a low level signal, the first transistor M1 is turned off, and the potential of the first node A and the potential of the second node B are floating. In this case, under control of the first noise reduction signal $v_1$, the fourth transistor M4 and the fifth transistor M5 are turned on and correspondingly output the power supply voltage signal Vgl to the first node A and the second node B to reduce the noise of the first node A and the second node B.

Figure 8:
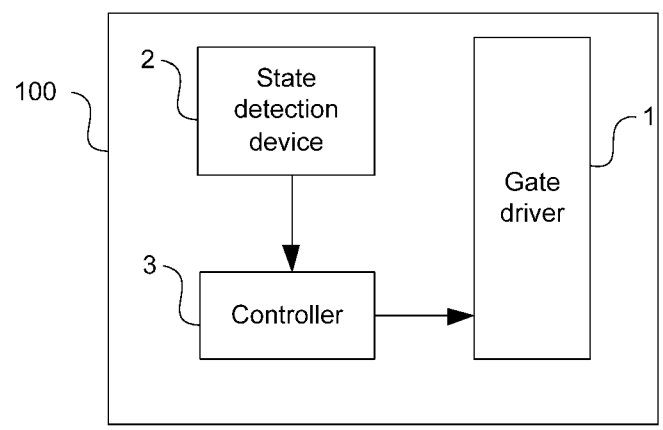
FIG. 8 is a schematic diagram showing a structure of a display apparatus in accordance with some embodiments.

As shown in FIG. 8, some embodiments of the present disclosure further provide a display apparatus 100 including a state detecting device 2, a controller 3, and a gate driving circuit 1 as described in any one of the above embodiments.

Herein, the state detecting device 2 is configured to detect an operating state of the display apparatus 100 in real time. The operating state includes operating temperature or refresh frequency.

In a case where the operating state of the display apparatus 100 satisfies a set condition, the controller 3 is configured to generate and output a control signal Hvgh having first level; and, in a case where the operating state of the display apparatus 100 does not satisfy the set condition, the controller 3 is configured to generate and output a control signal Hvgh having second level. The set condition is that the operating temperature of the display apparatus is less than a preset operating temperature, or the refresh frequency of the display apparatus is greater than a preset refresh frequency.

The control signal terminal HVGH of each shift register circuit SR of the gate driving circuit 1 is coupled to the controller 2 and receives the control signal having first level and the control signal having second level.

In this way, by using the state detecting device 2 to detect the operating state of the display apparatus 100 in real time, the controller 3 is enabled to output control signals Hvgh having different levels to each shift register circuit SR of the gate driving circuit 1 according to the operating state of the display apparatus 100 detected by the state detecting device 2. In a case where the operating temperature of the display apparatus is lower than the preset operating temperature or the refresh frequency of the display apparatus is greater than the preset refresh frequency, the controller 3 outputs a control signal Hvgh having first level. In a case where the operating temperature of the display apparatus is higher than or equals to the preset operating temperature, or the refresh frequency of the display apparatus is less than or equals to the preset refresh frequency, the controller 3 outputs a control signal Hvgh having second level.

Under control of the control signal Hvgh having first level, the first output sub-circuit 10 and the second output sub-circuit 20 of each shift register circuit SR operate simultaneously. This is equivalent to increasing the size of the output transistor, thereby improving the driving ability of the shift register circuit SR in a low temperature environment or a high frequency environment. Under control of the control signal Hvgh having second level, the first output sub-circuit 10 of each shift register circuit SR is turned off, and only the second output sub-circuit 20 operates. This is equivalent to reducing the size of the output transistor, thereby reducing the noise coupled to the pull-up node PU. Moreover, in a case where the first output sub-circuit 10 includes the second transistor M2 and the third transistor M3, it can also save the dynamic power consumption of the clock signal line.

In some embodiments, in a case where the state detecting device 2 can only detect the operating temperature of the display apparatus 100 in real time, the state detecting device 2 includes a temperature detecting sub-circuit configured to detect the operating temperature of the display apparatus 100 and transmit the detection result to the controller 3.

In a case where the state detecting device 2 can only detect the refresh frequency of the display apparatus 100 in real time, the state detecting device 2 includes a frequency detecting sub-circuit configured to detect the refresh frequency of the display apparatus 100 and transmit the detection result to the controller 3.

In a case where the state detecting device 2 can detect the operating temperature of the display apparatus 100 in real time and detect the refresh frequency of the display apparatus 100 in real time, the state detecting device 2 includes a temperature detecting sub-circuit and a frequency detecting sub-circuit, and both of which transmit the detection results to the controller 3. The controller 3 generates and outputs a control signal Hvgh having first level in a case where the operating temperature of the display apparatus is lower than the preset operating temperature, or the refresh frequency of the display apparatus is greater than the preset refresh frequency.

In some embodiments, the controller 3 may be a central processing unit (CPU) or an application specific integrated circuit (ASIC), as long as the corresponding control signal Hvgh can be generated according to the above detection result, which is not limited herein by the embodiments of the disclosure.

Figure 9:
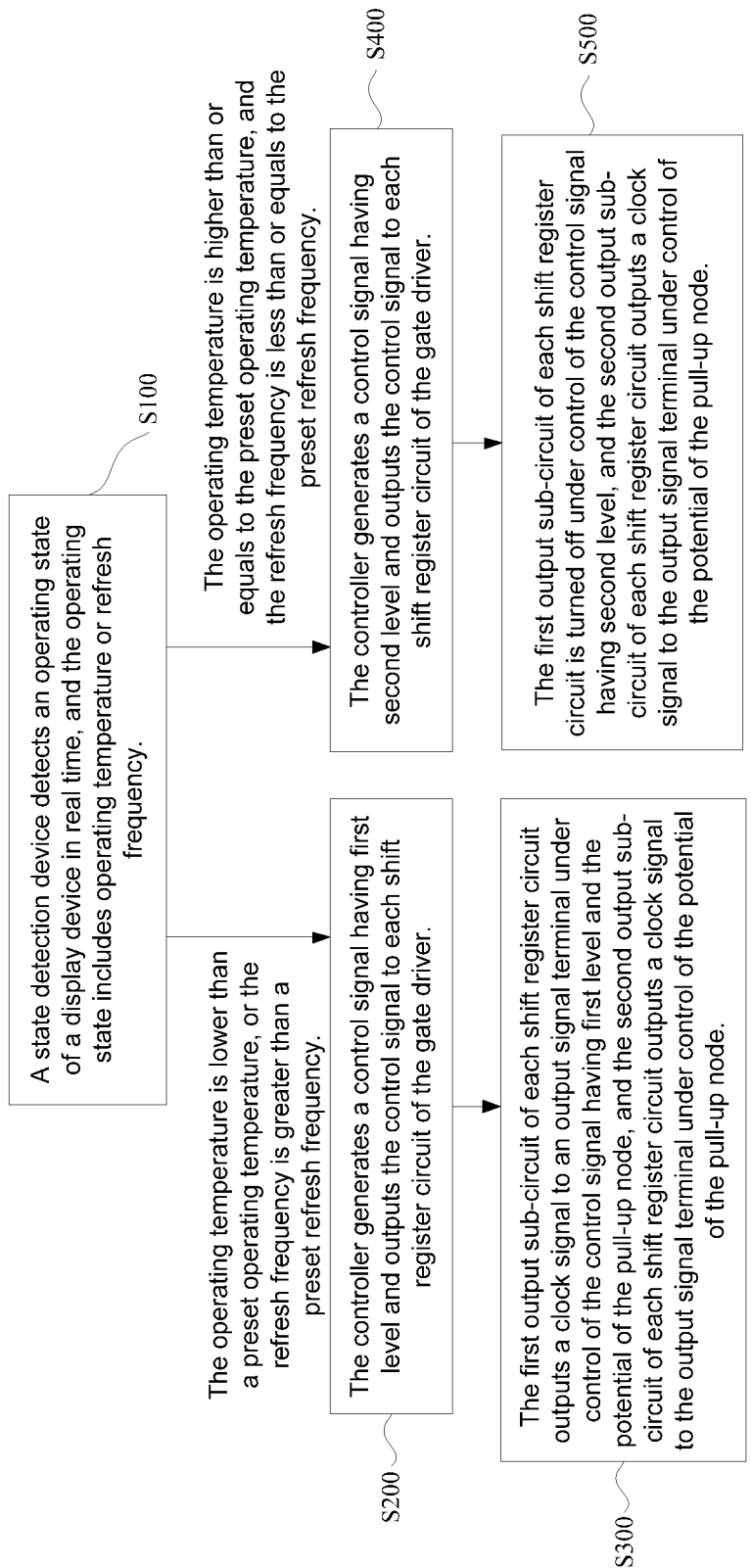
FIG. 9 is a flow chart of a method for a driving display apparatus in accordance with some embodiments.

As shown in FIG. 9, some embodiments of the present disclosure provide a method for driving the display apparatus 100 as described above, and the driving method includes S100 to S500.

In S100, the state detecting device 2 detects the operating state of the display apparatus in real time. The operating state includes operating temperature or refresh frequency.

In S200, in a case where the operating state of the display apparatus 100 satisfies the set condition, the controller 3 generates a control signal Hvgh having first level, and outputs the control signal Hvgh to each shift register circuit SR of the gate driving circuit 1.

In S300, under control of the control signal Hvgh having first level and the potential of the pull-up node PU, the first output sub-circuit 10 of each shift register circuit SR outputs a clock signal Clk to the output signal terminal OUTPUT, and the second output sub-circuit 20 of each shift register circuit SR outputs the clock signal Clk to the output signal terminal OUTPUT under control of the potential of the pull-up node PU.

In S400, in a case where the operating state of the display apparatus 100 does not satisfy the set condition, the controller 3 generates a control signal Hvgh having second level and output the control signal Hvgh to each shift of the register circuits SR of the gate driving circuit 1.

In S500, the first output sub-circuit 10 of each shift register circuit SR is turned off under control of the control signal Hvgh having second level, and the second output sub-circuit 20 of each shift register circuit SR outputs a clock signal Clk to the output signal terminal OUTPUT under control of the potential of the pull-up node PU.

Here, the S200 and the S400 are steps of working processes of the display apparatus 100 in different operating states. Therefore, S200 and S400 are two parallel steps without sequential order. S300 is subject to S200, and S500 is subject to S400. Therefore, S300 and S500 are also two parallel steps without sequential order.

Herein, the set condition is that the operating temperature of the display apparatus is lower than the preset working temperature, or the refresh frequency of the display apparatus is greater than preset refresh frequency. That is, when the operating temperature of the display apparatus is lower than the preset operating temperature or the refresh frequency of the display apparatus is greater than the preset refresh frequency, the operating state of the display apparatus 100 satisfies the set condition. When the operating temperature of the display apparatus 100 is higher than or equals to the preset operating temperature and the refresh frequency of the display apparatus 100 is less than or equals to the preset refresh frequency, the operating state of the display apparatus 100 does not satisfy the set condition.

Based on the above driving method, it can be realized that the first output sub-circuit 10 and the second output sub-circuit 20 of each shift register circuit SR operate simultaneously in a low temperature environment or a high frequency environment, so that the driving ability of the shift register circuit SR in the low temperature environment or the high frequency environment is improved. In a non-low temperature environment or a medium-or-low frequency environment, the first output sub-circuit 10 of each shift register circuit SR is turned off and only the second output sub-circuit 20 operates, which reduces the noise coupled to the pull-up node PU, and saves dynamic power consumption of the clock signal line in a case where the first output sub-circuit 10 includes the second transistor M2 and the third transistor M3.

It will be noted that the first level of the control signal Hvgh mentioned in the embodiments of the present disclosure is operating voltage of the control signal Hvgh. For example, the first level is high level or low level. The second level is non-operating voltage of the control signal Hvgh, for example, the second level is low level or high level.

In the description of the above embodiments, specific features, structures, connection relationship or characteristics may be combined in any suitable manners in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subjected to the protection scope of the claims.

What is claimed is:

1. A shift register circuit, comprising a first output sub-circuit and a second output sub-circuit; wherein
    the first output sub-circuit is coupled to a clock signal terminal, a control signal terminal, a pull-up node and an output signal terminal, and is configured to output a clock signal output via the clock signal terminal to the output signal terminal under control of a control signal having first level output via the control signal terminal and the potential of the pull-up node, and to be turned off under control of a control signal having second level output via the control signal terminal; and
    the second output sub-circuit is coupled to the clock signal terminal, the pull-up node and the output signal terminal, and is configured to output the clock signal to the output signal terminal under control of the potential of the pull-up node.

2. The shift register circuit according to claim 1, wherein the first output sub-circuit includes a first transistor and a second transistor;
    a control electrode of the first transistor is coupled to the control signal terminal, a first electrode of the first transistor is coupled to the pull-up node, and a second electrode of the first transistor is coupled to a control electrode of the second transistor; and
    a first electrode of the second transistor is coupled to the clock signal terminal, and a second electrode of the second transistor is coupled to the output signal terminal.

3. The shift register circuit according to claim 2, wherein the first output sub-circuit further includes a third transistor;
    a control electrode of the third transistor is coupled to the second electrode of the first transistor, a first electrode of the third transistor is coupled to the second electrode of the second transistor, and a second electrode of the third transistor is coupled to the output signal terminal; and
    the second electrode of the second transistor is indirectly coupled to the output signal terminal via the third transistor.

4. The shift register circuit according to claim 3, further comprising a first noise reduction sub-circuit; wherein
the first noise reduction sub-circuit is coupled to a first noise reduction signal terminal, a power supply voltage signal terminal and the first output sub-circuit, and is configured to output a power supply voltage signal output via the power supply voltage signal terminal to the first output sub-circuit under control of a first noise reduction signal output via the first noise reduction signal terminal.

5. The shift register circuit according to claim 4, wherein the first noise reduction sub-circuit includes a fourth transistor and a fifth transistor;
a control electrode of the fourth transistor is coupled to the first noise reduction signal terminal, a first electrode of the fourth transistor is coupled to the power supply voltage signal terminal, and a second electrode of the fourth transistor is coupled to the control electrode of the second transistor and the control electrode of the third transistor; and
a control electrode of the fifth transistor is coupled to the first noise reduction signal terminal, a first electrode of the fifth transistor is coupled to the power supply voltage signal terminal, and a second electrode of the fifth transistor is coupled to the second electrode of the second transistor and the first electrode of the third transistor.

6. The shift register circuit according to claim 1, wherein the second output sub-circuit includes a sixth transistor and a capacitor;
a control electrode of the sixth transistor is coupled to the pull-up node, a first electrode of the sixth transistor is coupled to the clock signal terminal, and a second electrode of the sixth transistor is coupled to the output signal terminal; and
one end of the capacitor is coupled to the pull-up node, and another end of the capacitor is coupled to the output signal terminal.

7. The shift register circuit according to claim 1, further comprising an input sub-circuit, at least one pull-down sub-circuit, a first reset sub-circuit, and at least one pull-down control sub-circuit; wherein
the input sub-circuit is coupled to an input signal terminal and the pull-up node, and is configured to output an input signal output via the input signal terminal to the pull-up node under control of the input signal;
each pull-down sub-circuit is coupled to a corresponding pull-down voltage signal terminal, the pull-up node, a corresponding pull-down node and a power supply voltage signal terminal, and is configured to output a corresponding pull-down voltage signal output via the corresponding pull-down voltage signal terminal to the corresponding pull-down node under control of the corresponding pull-down voltage signal, and is configured to output a power supply voltage signal output via the power supply voltage signal terminal to the corresponding pull-down node under control of the potential of the pull-up node;
the first reset sub-circuit is coupled to a first reset signal terminal, the pull-up node and the power supply voltage signal terminal, and is configured to output the power supply voltage signal to the pull-up node under control of a first reset signal output via the first reset signal terminal;
each pull-down control sub-circuit is coupled to the pull-up node, a corresponding pull-down node, the output signal terminal and the power supply voltage signal terminal, and is configured to output the power supply voltage signal to the pull-up node and the output signal terminal under control of the potential of the corresponding pull-down node;
the at least one pull-down sub-circuit is configured to be turned on in sequence, and only one pull-down sub-circuit is configured to be turned on during a same time period; and
the pull-down sub-circuit and the pull-down control sub-circuit coupled to the same pull-down node are configured to be simultaneously turned on or turned off.

8. The shift register circuit according to claim 7, wherein the input sub-circuit includes a seventh transistor;
a control electrode and a first electrode of the seventh transistor are coupled to the input signal terminal, and a second electrode of the seventh transistor is coupled to the pull-up node;
each pull-down sub-circuit includes a first pull-down transistor, a second pull-down transistor, a third pull-down transistor and a fourth pull-down transistor;
a control electrode and a first electrode of the first pull-down transistor are coupled to the corresponding pull-down voltage signal terminal, and a second electrode of the first pull-down transistor is coupled to a control electrode of the second pull-down transistor;
a first electrode of the second pull-down transistor is coupled to the corresponding pull-down voltage signal terminal, and a second electrode of the second pull-down transistor is coupled to the corresponding pull-down node;
a control electrode of the third pull-down transistor is coupled to the pull-up node, a first electrode of the third pull-down transistor is coupled to the power supply voltage signal terminal, and a second electrode of the third pull-down transistor is coupled to the control electrode of the second pull-down transistor;
a control electrode of the fourth pull-down transistor is coupled to the pull-up node, a first electrode of the fourth pull-down transistor is coupled to the power supply voltage signal terminal, and a second electrode of the fourth pull-down transistor is coupled to the corresponding pull-down node;
the first reset sub-circuit includes a twelfth transistor;
a control electrode of the twelfth transistor is coupled to the first reset signal terminal, a first electrode of the twelfth transistor is coupled to the power supply voltage signal terminal, and a second electrode of the twelfth transistor is coupled to the pull-up node;
each pull-down control sub-circuit includes a first pull-down control transistor and a second pull-down control transistor;
a control electrode of the first pull-down control transistor is coupled to the corresponding pull-down node, a first electrode of the first pull-down control transistor is coupled to the power supply voltage signal terminal, and a second electrode of the first pull-down control transistor is coupled to the pull-up node; and
a control electrode of the second pull-down control transistor is coupled to the corresponding pull-down node, a first electrode of the second pull-down control transistor is coupled to the power supply voltage signal terminal, and a second electrode of the second pull-down control transistor is coupled to the output signal terminal.

9. The shift register circuit according to claim 7, wherein the at least one pull-down sub-circuit includes a first pull-down sub-circuit and a second pull-down sub-circuit, the at least one pull-down control sub-circuit includes a first pull-down control sub-circuit and a second pull-down control sub-circuit, and the pull-down node includes a first pull-down node and a second pull-down node;
- the first pull-down sub-circuit is coupled to the first pull-down node and is further coupled to a first pull-down voltage signal terminal via which a first pull-down voltage signal is output;
- the second pull-down sub-circuit is coupled to the second pull-down node and is further coupled to a second pull-down voltage signal terminal via which a second pull-down voltage signal is output;
- the first pull-down control sub-circuit is coupled to the first pull-down node, and the second pull-down control sub-circuit is coupled to the second pull-down node; and
- the first pull-down sub-circuit and the second pull-down sub-circuit are configured to be alternately turned on or turned off, the first pull-down control sub-circuit and the second pull-down control sub-circuit are configured to be alternately turned on or turned off, the first pull-down sub-circuit and the first pull-down control sub-circuit are configured to be simultaneously turned on or turned off, and the second pull-down sub-circuit and the second pull-down control sub-circuit are configured to be simultaneously turned on or turned off.

10. The shift register circuit according to claim 7, further comprising a second reset sub-circuit; wherein
- the second reset sub-circuit is coupled to a second reset signal terminal, the output signal terminal and the power supply voltage signal terminal, and is configured to output a voltage of the power supply voltage signal terminal to the output signal terminal under control of a second reset signal output via the second reset signal terminal.

11. The shift register circuit according to claim 10, wherein the second reset sub-circuit includes a fifteenth transistor; and
- a control electrode of the fifteenth transistor is coupled to the second reset signal terminal, a first electrode of the fifteenth transistor is coupled to the power supply voltage signal terminal, and a second electrode of the fifteenth transistor is coupled to the output signal terminal.

12. The shift register circuit according to claim 1, further comprising a second noise reduction sub-circuit; and
- the second noise reduction sub-circuit is coupled to a second noise reduction signal terminal, a power supply voltage signal terminal, the pull-up node and the output signal terminal, and is configured to output the power supply voltage signal to the pull-up node and the output signal terminal under control of a second noise reduction signal output via the second noise reduction signal terminal.

13. The shift register circuit according to claim 12, wherein the second noise reduction sub-circuit includes a twenty-second transistor and a twenty-third transistor;
- a control electrode of the twenty-second transistor is coupled to the second noise reduction signal terminal, a first electrode of the twenty-second transistor is coupled to the power supply voltage signal terminal, and a second electrode of the twenty-second transistor is coupled to the pull-up node; and
- a control electrode of the twenty-third transistor is coupled to the second noise reduction signal terminal, a first electrode of the twenty-third transistor is coupled to the power supply voltage signal terminal, and a second electrode of the twenty-third transistor is coupled to the output signal terminal.

14. The shift register circuit according to claim 1, further comprising an input sub-circuit, a first pull-down sub-circuit, a first reset sub-circuit, and a first pull-down control sub-circuit, wherein
- the first output sub-circuit includes a first transistor, a second transistor and a third transistor;
- a control electrode of the first transistor is coupled to the control signal terminal, a first electrode of the first transistor is coupled to the pull-up node, and a second electrode of the first transistor is coupled to a control electrode of the second transistor and a control electrode of the third transistor;
- a first electrode of the second transistor is coupled to the clock signal terminal, and a second electrode of the second transistor is coupled to a first electrode of the third transistor;
- a second electrode of the third transistor is coupled to the output signal terminal;
- the second output sub-circuit includes a sixth transistor and a capacitor;
- a control electrode of the sixth transistor is coupled to the pull-up node, a first electrode of the sixth transistor is coupled to the clock signal terminal, and a second electrode of the sixth transistor is coupled to the output signal terminal;
- one end of the capacitor is coupled to the pull-up node, and another end of the capacitor is coupled to the output signal terminal;
- the input sub-circuit includes a seventh transistor;
- A control electrode and a first electrode of the seventh transistor are coupled to an input signal terminal, and a second electrode of the seventh transistor is coupled to the pull-up node;
- the first pull-down sub-circuit includes an eighth transistor, a ninth transistor, a tenth transistor and an eleventh transistor;
- a control electrode and a first electrode of the eighth transistor are coupled to a first pull-down voltage signal terminal, and a second electrode of the eighth transistor is coupled to a control electrode of the ninth transistor;
- a first electrode of the ninth transistor is coupled to the first pull-down voltage signal terminal, and a second electrode of the ninth transistor is coupled to a first pull-down node;
- a control electrode of the tenth transistor is coupled to the pull-up node, a first electrode of the tenth transistor is coupled to a power supply voltage signal terminal, and a second electrode of the tenth transistor is coupled to the control electrode of the ninth transistor;
- A control electrode of the eleventh transistor is coupled to the pull-up node, a first electrode of the eleventh transistor is coupled to the power supply voltage signal terminal, and a second electrode of the eleventh transistor is coupled to the first pull-down node;
- the first reset sub-circuit includes a twelfth transistor;
- a control electrode of the twelfth transistor is coupled to a first reset signal terminal, a first electrode of the twelfth transistor is coupled to the power supply voltage signal terminal, and a second electrode of the twelfth transistor is coupled to the pull-up node;
- the first pull-down control sub-circuit includes a thirteenth transistor and a fourteenth transistor;
- a control electrode of the thirteenth transistor is coupled to the first pull-down node, a first electrode of the thirteenth transistor is coupled to the power supply voltage signal terminal, and a second electrode of the thirteenth transistor is coupled to the pull-up node; and a control electrode of the fourteenth transistor is coupled to the first pull-down node, a first electrode of the fourteenth transistor is coupled to the power supply voltage signal terminal, and a second electrode of the fourteenth transistor is coupled to the output signal terminal.

15. The shift register circuit according to claim 14, further comprising a first noise reduction sub-circuit, a second reset sub-circuit, a second pull-down sub-circuit, a second pull-down control sub-circuit, and a second noise reduction sub-circuit; wherein the first noise reduction sub-circuit includes a fourth transistor and a fifth transistor;

a control electrode of the fourth transistor is coupled to a first noise reduction signal terminal, a first electrode of the fourth transistor is coupled to the power supply voltage signal terminal, a second electrode of the fourth transistor is coupled to the control electrode of the second transistor and the control electrode of the third transistor;

a control electrode of the fifth transistor is coupled to the first noise reduction signal terminal, a first electrode of the fifth transistor is coupled to the power supply voltage signal terminal, and a second electrode of the fifth transistor is coupled to the second electrode of the second transistor and the first electrode of the third transistor;

the second reset sub-circuit includes a fifteenth transistor;

a control electrode of the fifteenth transistor is coupled to a second reset signal terminal, a first electrode of the fifteenth transistor is coupled to the power supply voltage signal terminal, and a second electrode of the fifteenth transistor is coupled to the output signal terminal;

the second pull-down sub-circuit includes a sixteenth transistor, a seventeenth transistor, an eighteenth transistor and a nineteenth transistor;

a control electrode and a first electrode of the sixteenth transistor are coupled to a second pull-down voltage signal terminal, and a second electrode of the sixteenth transistor is coupled to a control electrode of the seventeenth transistor;

a first electrode of the seventeenth transistor is coupled to the second pull-down voltage signal terminal, and a second electrode of the seventeenth transistor is coupled to a second pull-down node;

a control electrode of the eighteenth transistor is coupled to the pull-up node, a first electrode of the eighteenth transistor is coupled to the power supply voltage signal terminal, and a second electrode of the eighteenth transistor is coupled to the control electrode of the seventeenth transistor;

a control electrode of the nineteenth transistor is coupled to the pull-up node, a first electrode of the nineteenth transistor is coupled to the power supply voltage signal terminal, and a second electrode of the nineteenth transistor is coupled to the second pull-down node;

the second pull-down control sub-circuit includes a twentieth transistor and a twenty-first transistor;

a control electrode of the twentieth transistor is coupled to the second pull-down node, a first electrode of the twentieth transistor is coupled to the power supply voltage signal terminal, and a second electrode of the twentieth transistor is coupled to the pull-up node;

a control electrode of the twenty-first transistor is coupled to the second pull-down node, a first electrode of the twenty-first transistor is coupled to the power supply voltage signal terminal, and a second electrode of the twenty-first transistor is coupled to the output signal terminal;

the second noise reduction sub-circuit includes a twenty-second transistor and a twenty-third transistor;

a control electrode of the twenty-second transistor is coupled to a second noise reduction signal terminal, a first electrode of the twenty-second transistor is coupled to the power supply voltage signal terminal, and a second electrode of the twenty-second transistor is coupled to the pull-up node; and a control electrode of the twenty-third transistor is coupled to the second noise reduction signal terminal, a first electrode of the twenty-third transistor is coupled to the power supply voltage signal terminal, and a second electrode of the twenty-third transistor is coupled to the output signal terminal.

16. A gate driving circuit comprising a plurality of shift register circuits which are cascaded, wherein each shift register circuit is a shift register circuit according to claim 1.

17. The gate driving circuit according to claim 16, further comprising six clock signal lines; wherein each shift register circuit includes an input signal terminal, a clock signal terminal, a first reset signal terminal, and an output signal terminal;

the plurality of shift register circuits are divided into a plurality of sets of shift register circuits, each set of shift register circuits includes six adjacent shift register circuits, and clock signal terminals of the six adjacent shift register circuits of each set of shift register circuits are coupled to the six clock signal lines in a one to one correspondence;

input signal terminals of the first three stages of the shift register circuits are coupled to a frame start signal terminal; and except the first three stages of the shift register circuits, the input signal terminal of the Nth stage shift register circuit is coupled to the output signal terminal of the (N−3)th stage shift register circuit, first reset signal terminals of the last four stages of the shift register circuits are coupled to output signal terminals of four stages of dummy shift register circuits in a one to one correspondence, and except the last four stages of the shift register circuits, the first reset signal terminal of the Nth stage shift register circuit is coupled to the output signal terminal of the (N+4)th stage shift register circuit.

18. The gate driving circuit according to claim 17, wherein each shift register circuit further includes a second reset signal terminal and/or a first noise reduction signal terminal; and the second reset signal terminal of the Nth stage shift register circuit is coupled to the output signal terminal of the (N+3)th stage shift register circuit;

the first noise reduction signal terminal of each shift register circuit is coupled to the frame start signal terminal.

19. A display apparatus, comprising:

a state detection device configured to detect an operating state of the display apparatus in real time, and the operating state including operating temperature or refresh frequency;

a controller configured to generate and output a control signal having first level in a case where the operating state of the display apparatus satisfies a set condition and is configured to generate and output a control signal having second level in a case where the operating state of the display apparatus does not satisfy the set condition, and the set condition being that the operating temperature of the display apparatus is lower than a preset operating temperature, or the refresh frequency of the display apparatus is greater than a preset refresh frequency; and a gate driving circuit according to claim 16, wherein the control signal terminal of each shift register circuit of the gate driving circuit is coupled to the controller and receives the control signal having first level and the control signal having second level.

20. A method for driving a display apparatus, comprising:

a state detection device detecting an operating state of the display apparatus in real time, and the operating state including operating temperature or refresh frequency;

in a case where the operating state of the display apparatus satisfies a set condition, a controller generating a control signal having first level and outputting the control signal to each shift register circuit of a gate driving circuit, and the set condition being that the operating temperature of the display apparatus is lower than a preset operating temperature or the refresh frequency of the display apparatus is greater than a preset refresh frequency;

a first output sub-circuit of each shift register circuit outputting a clock signal to an output signal terminal under control of the control signal having first level and the potential of a pull-up node, and a second output sub-circuit of each shift register circuit outputting the clock signal to the output signal terminal under control of the potential of the pull-up node;

in a case where the operating state of the display apparatus does not satisfy the set condition, a controller generating a control signal having second level and outputting the control signal to each shift register circuit of a gate driving circuit; and the first output sub-circuit of each shift register circuit turned off under control of the control signal having second level, and the second output sub-circuit of each shift register circuit outputting the clock signal to the output signal terminal under control of the potential of the pull-up node.

* * * * *